US012603141B2

(12) United States Patent
Choi et al.

(10) Patent No.: US 12,603,141 B2
(45) Date of Patent: Apr. 14, 2026

(54) MEMORY SYSTEM AND OPERATING METHOD THEREOF

(71) Applicant: SAMSUNG ELECTRONICS CO., LTD., Suwon-si (KR)

(72) Inventors: Minkyeong Choi, Suwon-si (KR); Joonsuc Jang, Suwon-si (KR); Ji-Sang Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

(21) Appl. No.: 18/423,047

(22) Filed: Jan. 25, 2024

(65) Prior Publication Data

US 2024/0249782 A1     Jul. 25, 2024

(30) Foreign Application Priority Data

Jan. 25, 2023   (KR) ........................ 10-2023-0009631
Aug. 4, 2023   (KR) ........................ 10-2023-0102463

(51) Int. Cl.
| | |
|---|---|
| *G11C 7/04* | (2006.01) |
| *G11C 16/04* | (2006.01) |
| *G11C 16/34* | (2006.01) |

(52) U.S. Cl.
CPC .............. *G11C 16/349* (2013.01); *G11C 7/04* (2013.01); *G11C 16/0483* (2013.01)

(58) Field of Classification Search
CPC .............. G11C 16/349; G11C 16/0483; G11C 11/5642; G11C 16/08; G11C 16/10; G11C 16/26; G11C 16/32; G11C 16/3418
See application file for complete search history.

(56) References Cited

U.S. PATENT DOCUMENTS

| | | | |
|---|---|---|---|
| 9,672,940 B1 | 6/2017 | Reusswig et al. | |
| 10,658,064 B2 | 5/2020 | Lee | |
| 10,698,610 B2 | 6/2020 | Yang | |
| 10,811,070 B2 | 10/2020 | Tomose | |
| 11,107,538 B2 | 8/2021 | Her et al. | |
| 11,145,374 B2 | 10/2021 | Kojima | |
| 11,314,452 B2 | 4/2022 | Lim et al. | |
| 2016/0239235 A1* | 8/2016 | Chung ..................... | G11C 7/04 |
| 2018/0268917 A1 | 9/2018 | Lee | |
| 2019/0265888 A1 | 8/2019 | Yang | |
| 2020/0090725 A1 | 3/2020 | Tomose | |
| 2020/0393992 A1 | 12/2020 | Lim et al. | |
| 2021/0110877 A1 | 4/2021 | Kojima | |
| 2021/0118515 A1 | 4/2021 | Her et al. | |
| 2022/0066872 A1 | 3/2022 | Kwon et al. | |
| 2022/0068399 A1* | 3/2022 | Cho ......................... | G11C 7/04 |
| 2022/0130473 A1 | 4/2022 | Choi | |
| 2022/0293183 A1* | 9/2022 | Padilla ..................... | G11C 7/04 |

* cited by examiner

*Primary Examiner* — Jay W. Radke
(74) *Attorney, Agent, or Firm* — Sughrue Mion, PLLC

(57) ABSTRACT

A memory system includes: a memory device including a memory cell array and a control circuit; and a temperature sensor configured to measure a temperature of the memory device to generate a temperature value, wherein the control circuit is configured to: set a compensation sensing parameter based on the temperature value, determine a sensing parameter by applying the compensation sensing parameter to a basic sensing parameter corresponding to a read mode among a plurality of read modes having different read speeds, and read data from the memory cell array based on the sensing parameter.

20 Claims, 11 Drawing Sheets

BLK1

Figure 14:
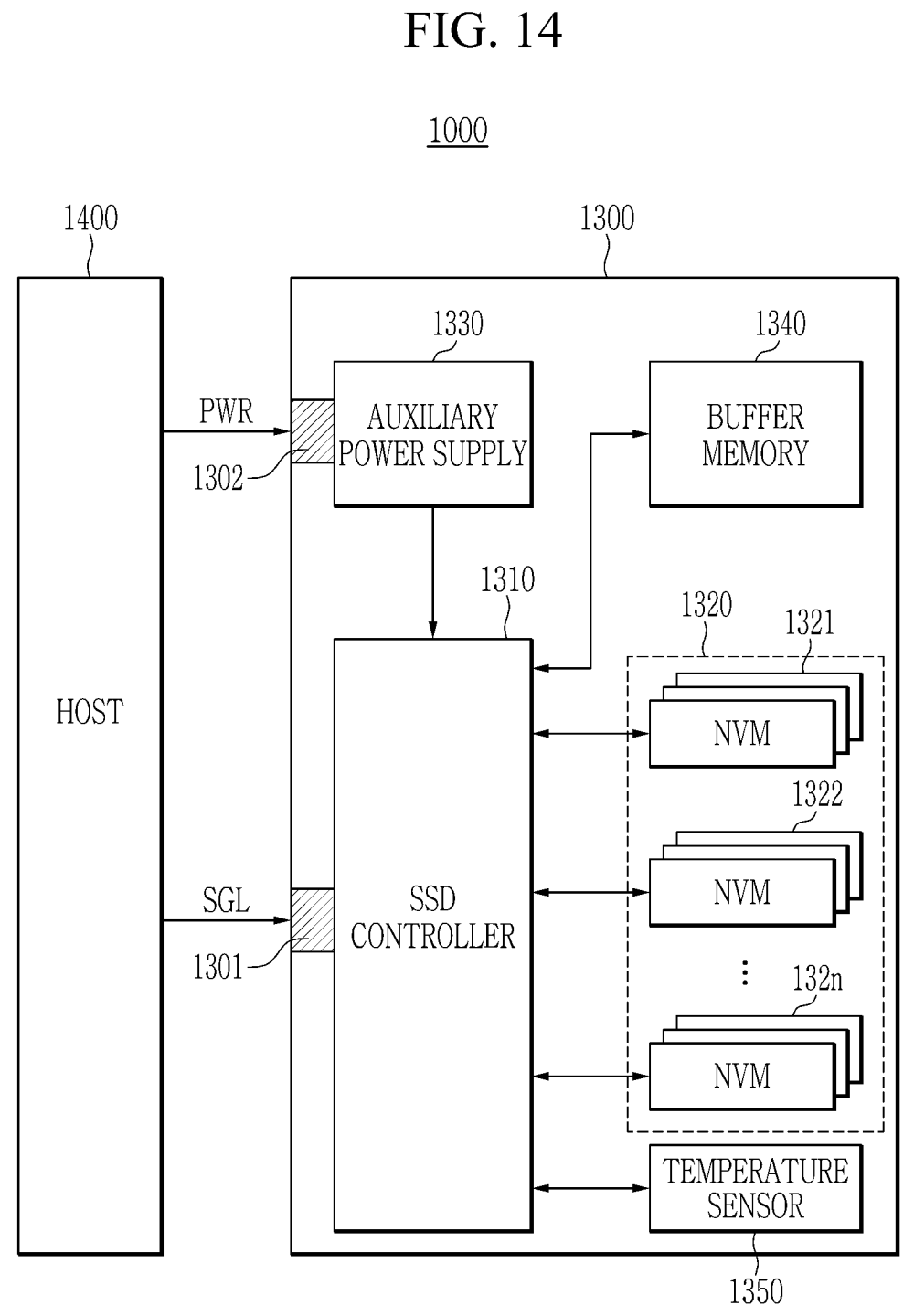

PWR          AUXILIARY          BUFFER
                POWER SUPPLY          MEMORY

1302

HOST 1310          1320          1321

NVM

1322

NVM

SGL          SSD          132n
                CONTROLLER

1301          NVM

TEMPERATURE
SENSOR

1350

MEMORY SYSTEM AND OPERATING METHOD THEREOF

CROSS-REFERENCE TO RELATED APPLICATIONS

This application claims priority to Korean Patent Application No. 10-2023-0009631, filed on Jan. 25, 2023, and Korean Patent Application No. 10-2023-0102463, filed on Aug. 4, 2023, in the Korean Intellectual Property Office, the disclosures of which are incorporated by reference herein in their entireties.

BACKGROUND

1. Field

The present disclosure relates to a memory system and an operating method thereof.

2. Description of Related Art

Along with recent multi-functionalization of an information communication device, large capacity and high integration of a memory device are required. The memory device may include a page buffer connected to bit lines of memory cells to store data in or output data from the memory cells, and the page buffer may have semiconductor elements such as transistors.

On the other hand, an operating characteristic (e.g., a level of current flowing through the memory cell or the like) of the memory device may vary depending on temperature. There is a problem in which reliability of data sensed from the page buffer may be deteriorated as the operating characteristic changes.

SUMMARY

Example embodiments provide a memory system and an operating method thereof which may compensate for a change in a cell current depending on a temperature of a memory device.

According to an aspect of an example embodiment, a memory system includes: a memory device including a memory cell array and a control circuit; and a temperature sensor configured to measure a temperature of the memory device to generate a temperature value, wherein the control circuit is configured to: set a compensation sensing parameter based on the temperature value, determine a sensing parameter by applying the compensation sensing parameter to a basic sensing parameter corresponding to a read mode among a plurality of read modes having different read speeds, and read data from the memory cell array based on the sensing parameter.

According to an aspect of an example embodiment, a memory system includes: a memory device including a memory cell array and a control circuit; a memory controller configured to determine a read mode among a plurality of read modes associated with different read speeds based on a reliability index of the memory device; and a temperature sensor configured to measure a temperature of the memory device to generate a temperature value, wherein the control circuit is configured to: set a compensation sensing parameter based on the temperature value, determine a sensing parameter by applying the compensation sensing parameter to a basic sensing parameter corresponding to the read mode, and read data from the memory cell array based on the sensing parameter.

According to an aspect of an example embodiment, an operating method of a memory system, includes: receiving, by a memory controller, a read command for a memory device, wherein the memory device includes a memory cell array; determining, by the memory controller, a reliability of the memory device; determining, by the memory controller, a read mode of the memory device among a plurality of read modes having different read speeds based on the reliability; setting, by the memory device, a compensation sensing parameter based on a temperature and the read mode of the memory device; and reading, by the memory device, data corresponding to the read command based on a basic sensing parameter corresponding to the read mode and the compensation sensing parameter.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 14 is a block diagram showing an SSD system to which the memory device is applied according to an embodiment.

DETAILED DESCRIPTION

Figure 1:
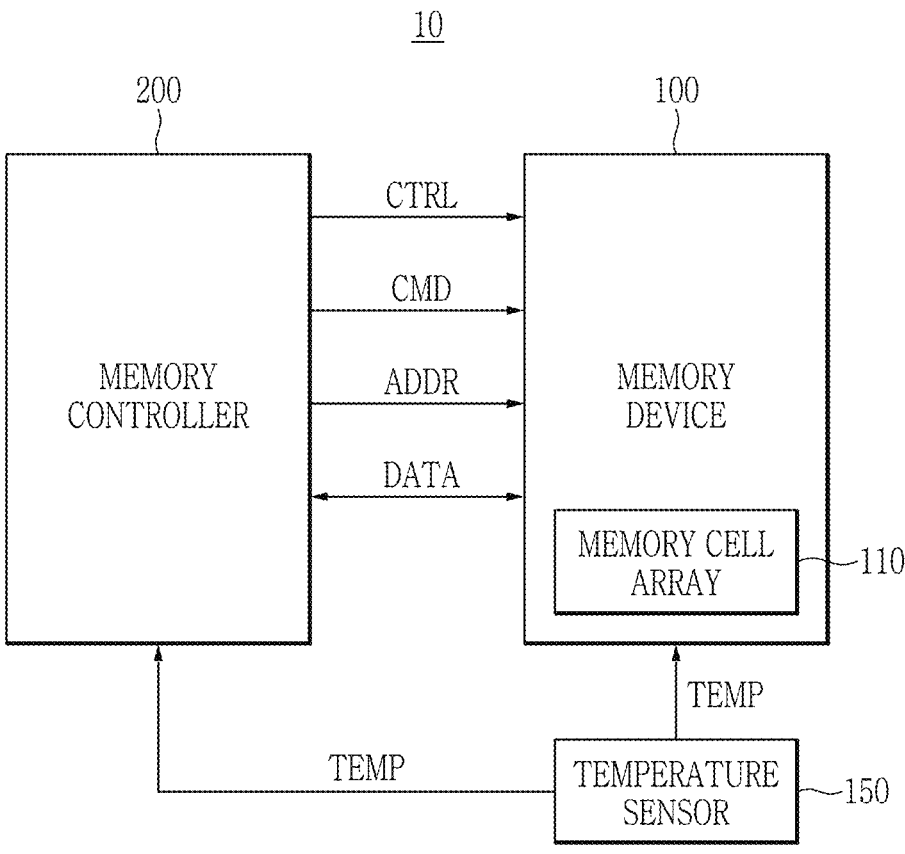
FIG. 1 is a block diagram showing a memory system according to an embodiment.

Example embodiments of the present disclosure will be described more fully hereinafter with reference to the accompanying drawings. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In the flowchart described with reference to the drawings, various operations may be merged, a certain operation may be divided, and a certain operation may not be performed.

In addition, a singular form may be intended to include a plural form as well, unless the explicit expression such as "one" or "single" is used. Terms including ordinal numbers such as first, second, and the like will be used only to describe various constituent elements, and are not to be interpreted as limiting these constituent elements. These terms may be used for a purpose of distinguishing one constituent element from other constituent elements.

FIG. 1 is a block diagram showing a memory system according to an embodiment.

The memory system 10 may be used in various electronic systems. For example, the electronic system may include various devices such as a smart phone, a tablet PC, a computer, a TV, and the like. The memory system 10 may be applied to an embedded memory multimedia card (eMMC), a secure digital (SD) card, a micro SD card, a universal flash storage (UFS), a solid-state drive (SSD), or the like.

Referring to FIG. 1, the memory system 10 may include a memory device 100, a temperature sensor 150, and a memory controller 200. The memory system 10 may store data received from a host in the memory device 100 based on an access request from the host, or may read data requested by the host from the memory device 100 to transmit the read data to the host.

The memory device 100 may include a flash-based memory (for example, a NAND flash memory). The flash memory may include a 2D NAND memory array or a 3D (or vertical) NAND (VNAND) memory array. In an embodiment, for example, the memory device 100 may include a phase-change memory, a resistive memory, a magnetoresistive memory, a ferroelectric memory, or a polymer memory.

The memory device 100 includes a memory cell array 110. The memory cell array 110 may include a plurality of memory cells.

The temperature sensor 150 may measure a temperature of the memory device 100. Measuring the temperature of the memory device 100 may include measuring an operating temperature of the memory device 100 or detecting (or sensing) a change in a temperature of a surrounding environment where the memory device 100 is disposed to measure the changed temperature. The temperature sensor 150 may provide the measured temperature TEMP to the memory controller 200 and/or the memory device 100.

On the other hand, in FIG. 1, the temperature sensor 150 is shown as a separate configuration from the memory controller 200 and the memory device 100, but the present disclosure is not limited thereto, and the temperature sensor 150 may be disposed within the memory controller 200 or within the memory device 100.

The memory controller 200 may control access to the memory device 100.

The memory controller 200 provides a control signal CTRL, a command CMD, an address ADDR, and the like to the memory device 100. The control signal CTRL may include information necessary when the memory device 100 performs an operation corresponding to the command CMD received from the memory controller 200. For example, the control signal CTRL may include information on sensing parameters necessary when the memory device 100 reads data from the memory cell array 110. The address ADDR may indicate a position that the memory controller 200 wants to access in the memory device 100. Data DATA may be transmitted and received between the memory controller 200 and the memory device 100 based on the command CMD and the address ADDR.

The memory controller 200 may control an operation in which data DATA are programmed in the memory device 100, an operation in which data DATA are read from the memory device 100, or an operation in which data DATA of the memory device 100 are erased in response to the access request from the host. For example, the memory controller 200 may transfer data DATA received from the host to the memory device 100 by executing a program command, or may transfer data DATA read from the memory device 100 to the host by executing a read command. In addition, the memory controller 200 may provide a clock signal, a chip select signal, or the like to the memory device 100.

The memory controller 200 may perform an operation in which reliability of the memory device 100 is determined. The higher the reliability of the memory device 100, the lower a probability of a fail bit or an error bit occurring within data read from the memory device 100. Specifically, the memory controller 200 may determine the reliability of the memory device 100 based on a reliability index of the memory device 100. In an embodiment, the reliability index may include an address of a cell to be accessed, a retention time of the memory device 100, a program/erase count of the memory device 100, and the like.

For example, when the memory controller 200 receives a read request for data within a central significant bit (CSB) page from the host, it may determine that the memory device 100 has low reliability. For another example, the memory controller 200 may determine that the memory device 100 has low reliability when it receives a read request for data corresponding to an address where uncorrectable data (UECC) is disposed. For another example, the memory controller 200 may determine that the memory device 100 has low reliability when it receives a read request for data corresponding to a defective address. The defective address may be determined during a process, and information on the defective address may be stored in advance.

The retention time may be a time elapsed from a time in which the memory device 100 programs data in the memory cell array 110 that is a data retention time. A threshold voltage of a cell within the memory cell array 110 may change due to a threshold voltage of a cell adjacent to the cell or a unique characteristic of the cell. Accordingly, the memory controller 200 may determine that the longer the retention time, the lower the reliability of the memory device 100.

The memory controller 200 may program data in the memory device 100, may erase the data programmed in the memory device 100 after a certain period of time, and may program data again. The program/erase count may be the number of times the memory device 100 programs data in the memory cell array 110, erases the data programmed in the memory cell array 110, and then programs data in the memory cell array 110 again. As the program/erase count increases, a characteristic of the memory cell array 110 may deteriorate, so that the memory controller 200 determines that the memory device 100 has low reliability.

The memory controller 200 may determine a read mode based on the reliability of the memory device 100. The read mode may include a plurality of read modes with different read speeds. For example, the read mode may include at least two modes depending on the read speed. In an embodiment, the read mode may include a normal read mode and a fast read mode having a read speed faster than a read speed of the normal read mode. For example, a voltage application time for applying a voltage to the memory cell to read data from the memory cell in the normal read mode is longer than a voltage application time for applying a voltage to the memory cell to read data from the memory cell in the fast read mode. The normal read mode may have a read speed set considering stability of the memory device 100. For example, the read speed may be close to a minimum speed among a maximum speed and the minimum speed of the read speed at which the memory device 100 may operate. If the reliability of the memory device 100 is relatively low, the memory controller 200 may determine that the memory device 100 reads data in the normal read mode. If the reliability of the memory device 100 is relatively high, the memory controller 200 may control the memory device 100 to read data in a fast read mode. Sensing parameters required for the memory device 100 to read data according to each read mode may be preset in the memory device 100 and/or the memory controller 200. The sensing parameters may be parameters necessary for the memory device 100 to read data from the memory cell array 110. For example, the sensing parameters may include a word line voltage level, a bit line voltage level, a sensing node (SO) discharge time, or the like applied to the memory cell array 110 of the memory device 100. In this case, the SO discharge time may be a time taken from a time of setting a voltage for reading a selected memory cell to a time of sensing data stored in the memory cell.

The memory controller 200 may modify (or correct) the sensing parameter based on the temperature TEMP received from the temperature sensor 150. An operating characteristic of the memory device 100 is affected by temperature. For example, the larger a difference between a temperature when data are written in the memory device 100 and a temperature when data are read from the memory device 100, the higher a read error probability, and the smaller the difference, the lower the read error probability. The memory controller 200 may reflect the operating characteristic of the memory device 100 according to temperature to adjust the sensing parameter used when the memory device 100 reads data according to a measured temperature TEMP of the memory device 100. Specifically, the memory controller 200 may determine a compensation value for the sensing parameter that is a compensation sensing parameter according to the measured temperature TEMP of the memory device 100.

Figure 2:
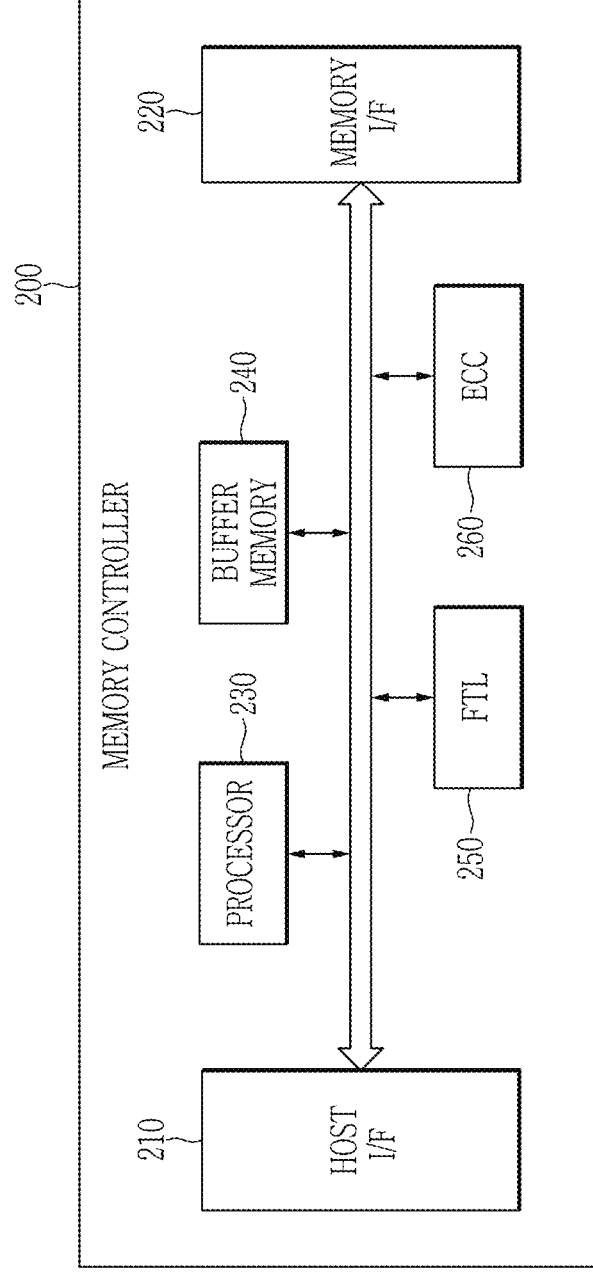
FIG. 2 is a view showing a memory controller according to an embodiment.

FIG. 2 is a view showing the memory controller according to an embodiment.

The memory controller 200 may control an operation of the memory device 100 of FIG. 1. For example, the memory controller 200 may provide the address ADDR, the command CMD, the data DATA, and the like to the memory device 100 in response to a request signal from the host. That is, the memory controller 200 may provide signals to the memory device 100 to write data in the memory device 100 or read data from the memory device 100.

Specifically, the memory controller 200 may include a host interface 210, a memory interface 220, a processor 230, a buffer memory 240, a flash translation layer (FTL) 250, an error correction code (ECC) engine 260, and the like.

The host interface 210 may transmit and receive a packet to and from the host. The packet that the host interface 210 receives from the host may include the command CMD, data DATA to be written in the memory device 100, or the like. The packet transmitted by the host interface 210 to the host may include a response to the command CMD, data DATA read from the memory device 100, or the like.

The memory interface 220 may transmit and receive a signal with the memory device 100. The memory interface 220 may transmit the command CMD and the address ADDR along with the data DATA to be written in the memory device 100 to the memory device 100, or may receive the data DATA read from the memory device 100. The memory interface 220 may be implemented to comply with a standard convention such as a toggle or an ONFI.

The FTL 250 may include firmware or software that manages data writing, data reading, and sub-block and/or block erasing operations of the memory device 100. The firmware of the FTL 250 may be executed by the processor 230. In an embodiment, the FTL 250 may be implemented through various hardware automation circuits.

The FTL 250 may also perform an operation according to a request from the host. In an embodiment, the FTL 250 may perform an operation for determining reliability of the memory device 100 when it receives a data read request from the host. For example, the FTL 250 may determine the reliability of the memory device 100 based on a cell address of the memory device 100 that is an access target, the retention time of the memory device 100, the program/erase count of the memory device 100, or the like.

The FTL 250 may perform various maintenance operations for efficiently using the memory device 100. Specifically, the FTL 250 may perform several functions such as address mapping, wear-leveling, and garbage collection.

In an embodiment, the FTL 250 may store data necessary to perform an operation of the FTL 250. For example, the FTL 250 may store the retention time of the memory device 100, the program/erase count of the memory device 100, block information of the memory device 100, a garbage collection level for performing garbage collection on the memory device 100, an address mapping table used to convert a logical address of the host to a physical address of the memory device 100, an address mapping table managed by a garbage collection or wear-leveling operation, data for determining the reliability of the memory device 100, a sensing parameter corresponding to a read mode of the memory device 100, or the like. On the other hand, the present disclosure is not limited thereto, and data for performing the operation of the FTL 250 may be stored in the buffer memory 240 or in the memory device 100.

The ECC engine 260 may perform error detection and correction functions on read data read from the memory device 100. The ECC engine 260 may be implemented as dedicated hardware, or may be implemented as firmware using the processor 230.

For example, the ECC engine 260 may generate parity bits for program data to be programmed in the memory device 100. The parity bits generated by the ECC engine 260 may be stored within the memory device 100 along with the program data. When data are read from the memory device 100, the ECC engine 260 may use parity bits read from the memory device 100 along with the read data to correct a fail bit of the read data and output read data with an error corrected.

On the other hand, if the number of fail bits is greater than or equal to the reference number, it may be impossible for the ECC engine 260 to correct an error of the read data. The read error may be referred to as the UECC.

The buffer memory 240 may store a command and data that are executed and processed by the memory controller 200. The buffer memory 240 may temporarily store data that are stored in or are to be stored in the memory device 100.

The buffer memory 240 may be implemented as a volatile memory such as a dynamic random access memory (DRAM), a static random access memory (SRAM), or the like. However, the present disclosure is not limited thereto, and the buffer memory 240 may be implemented as a resistive non-volatile memory such as a magnetic RAM (MRAM), a phase change RAM (PRAM), a resistive RAM (ReRAM), or the like, or various types of non-volatile memories such as a flash memory, a nano-floating gate memory (NFGM), a polymer random access memory (PoRAM), a ferroelectric random access memory (FRAM), and the like.

The buffer memory 240 may store code data necessary for determining the reliability of the memory device 100. The buffer memory 240 may store a temperature bump table. The temperature bump indicates a phenomenon in which a threshold voltage distribution of memory cells deteriorates when there is a difference between a temperature when data are programmed in the memory device 100 and a temperature when data are read from the memory device 100 in a high temperature programming/high temperature reading, a high temperature programming/low temperature reading, a low temperature programming/high temperature reading, a low temperature programming/low temperature reading, and the like. The temperature bump table may include information on an offset additionally applied to a voltage applied to a word line of the memory cell array 110 of FIG. 1 to compensate for a difference in the threshold voltage distribution depending on a difference between a program temperature and a read temperature. The temperature bump table may be experimentally obtained and set in manufacturing and testing steps of the memory device 100, or may be set by a user.

The buffer memory 240 may store an address at which the ECC engine 260 corrects an error and data on the number of times the ECC is performed.

The buffer memory 240 may buffer a logical block address within a request signal, the request signal, data, a command, or the like received from the host. Signals buffered in the buffer memory 240 may be transferred to the memory device 100 through the memory interface 220. For example, the data buffered in the buffer memory 240 may be programmed in the memory device 100.

On the other hand, in FIG. 2, the buffer memory 240 is shown as being provided inside the memory controller 200, but the present disclosure is not limited thereto, and the buffer memory 240 may be provided outside the memory controller 200.

The processor 230 may control an overall operation of the memory controller 200. The processor 230 may control memory controller 200 by driving firmware loaded on the FTL 250. In an embodiment, the processor 230 may include a central processing unit (CPU), a controller, an application specific integrated circuit (ASIC), or the like.

The processor 230 may drive various firmware or software driven in the memory controller 200. The processor 230 may use the buffer memory 240 as an operating memory of the processor 230. Additionally, the processor 230 may use the memory device 100 as the operating memory of the processor 230.

The processor 230 may control a data read operation from the memory device 100 by executing the firmware. The processor 230 may determine the read mode based on the reliability of the memory device 100. The processor 230 may read data from the memory device 100 using the sensing parameter corresponding to the read mode. The processor 230 may transmit the determined read mode and the sensing parameter corresponding to the read mode to the memory device 100 as the control signal CTRL. The processor 230 may control a data program operation in the memory device 100 by executing the firmware.

The processor 230 may modify the sensing parameter for the memory device 100 based on the temperature TEMP received from the temperature sensor 150. Specifically, a temperature when the processor 230 performs an operation on the memory device 100 may be stored in the buffer memory 240. For example, when the processor 230 writes data in one region of the memory cell array 110, a temperature when data are written may be stored in the buffer memory 240. Thereafter, when the processor 230 reads data from one region of the memory cell array 110, the processor 230 may receive a temperature when data are read from the temperature sensor 150. The processor 230 may modify the sensing parameter for the memory device 100 based on the temperature bump table of the buffer memory 240.

Figure 3:
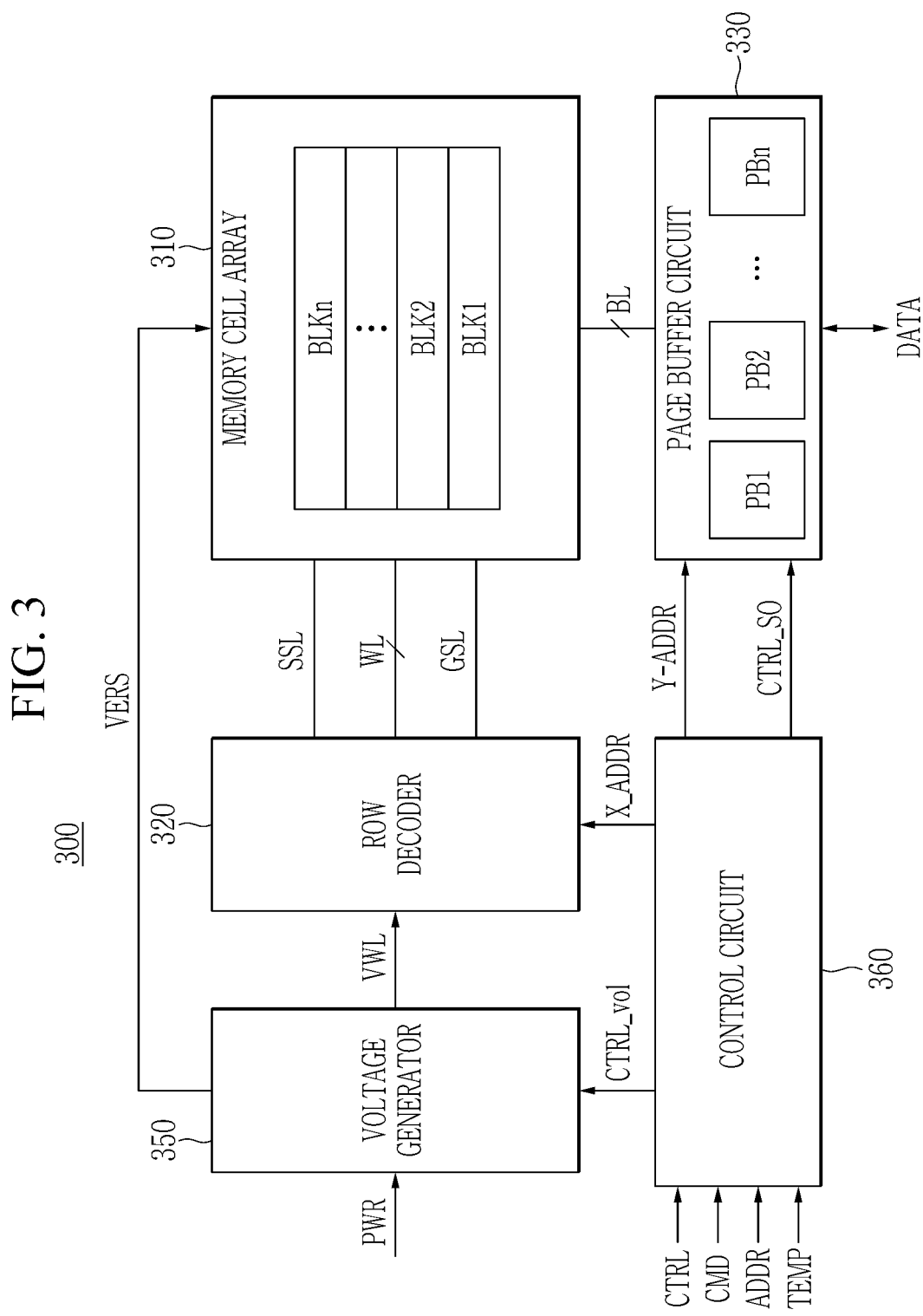
FIG. 3 is a block diagram showing a memory device according to an embodiment.

FIG. 3 is a block diagram showing the memory device according to an embodiment.

Referring to FIG. 3, the memory device 300 may include a control circuit 360, a memory cell array 310, a row decoder 320, a page buffer circuit 330, and a voltage generator 350.

The control circuit 360 may control the row decoder 320, the page buffer circuit 330, and the voltage generator 350 in response to the control signal CTRL, the command CMD, and the address ADDR transferred from the memory controller 200 of FIG. 1. In an embodiment, the control circuit 360 may generate a voltage control signal CTRL_vol, a row address X-ADDR, a column address Y-ADDR, and a sensing control signal CTRL_SO based on the temperature TEMP received from the temperature sensor 150, the control signal CTRL, the command CMD, and the address ADDR.

The control circuit 360 may control the row decoder 320 to select a memory cell corresponding to the row address X-ADDR based on the row address X-ADDR. The control circuit 360 may control the page buffer circuit 330 to perform a read operation and a write operation on a memory cell selected by the row decoder 320 based on the column address Y-ADDR and the sensing control signal CTRL_SO.

The memory cell array 310 may include a plurality of memory blocks BLK1-BLKn. Each of the plurality of memory blocks BLK1-BLKn may be connected to the row decoder 320 through a word line (or a wordline) WL, a string select line SSL, and a ground select line GSL. Additionally, the memory cell array 310 may be connected to the page buffer circuit 330 through a bit line BL.

The memory cell array 310 may include a non-volatile memory cell. For example, the memory cell array 310 may include a 2D NAND memory array or a 3D VNAND memory array.

The memory cell array 310 includes a plurality of memory cells defined by a plurality of rows and a plurality of columns. In an embodiment, the row may be defined by the word line WL, and the column may be defined by the bit line BL. The memory cell array 310 may include a plurality of memory blocks including a plurality of pages. The memory block may include a plurality of memory cells connected to one word line WL.

Each of a plurality of bit lines BL may be connected to a corresponding page buffer among a plurality of page buffers PB1-PBn. The n is an integer of 2 or more.

In an embodiment, the memory cell array 310 may include a three-dimensional memory cell array. The three-dimensional memory cell array may include a plurality of NAND strings, and each NAND string may include memory cells connected to the word line WL stacked vertically on a substrate. However, the present disclosure is not limited thereto, and in an embodiment, the memory cell array 310 may include a two-dimensional memory cell array.

The row decoder 320 may select at least one of the plurality of memory blocks BLK1-BLKn in response to the row address X-ADDR received from the control circuit 360. The row decoder 320 may select one word line WL among a plurality of word lines WL in response to the row address X-ADDR. The row decoder 320 may transfer a voltage corresponding to an operation of the memory block to the word line WL of a selected memory block.

The page buffer circuit 330 may include the plurality of page buffers PB1-PBn. Here, each of the plurality of page buffers PB1-PBn may be connected to memory cells through a corresponding bit line among the plurality of bit lines BL. The page buffer circuit 330 may select at least one bit line from the plurality of bit lines BL in response to the column address Y-ADDR received from the control circuit 360.

The page buffer circuit 330 may operate as a write driver for writing data in the memory cell array 310 or as a sense amplifier for reading data stored in the memory cell array 310 depending on an operating mode. The page buffer circuit 330 will be described with reference to FIG. 4.

Figure 4:
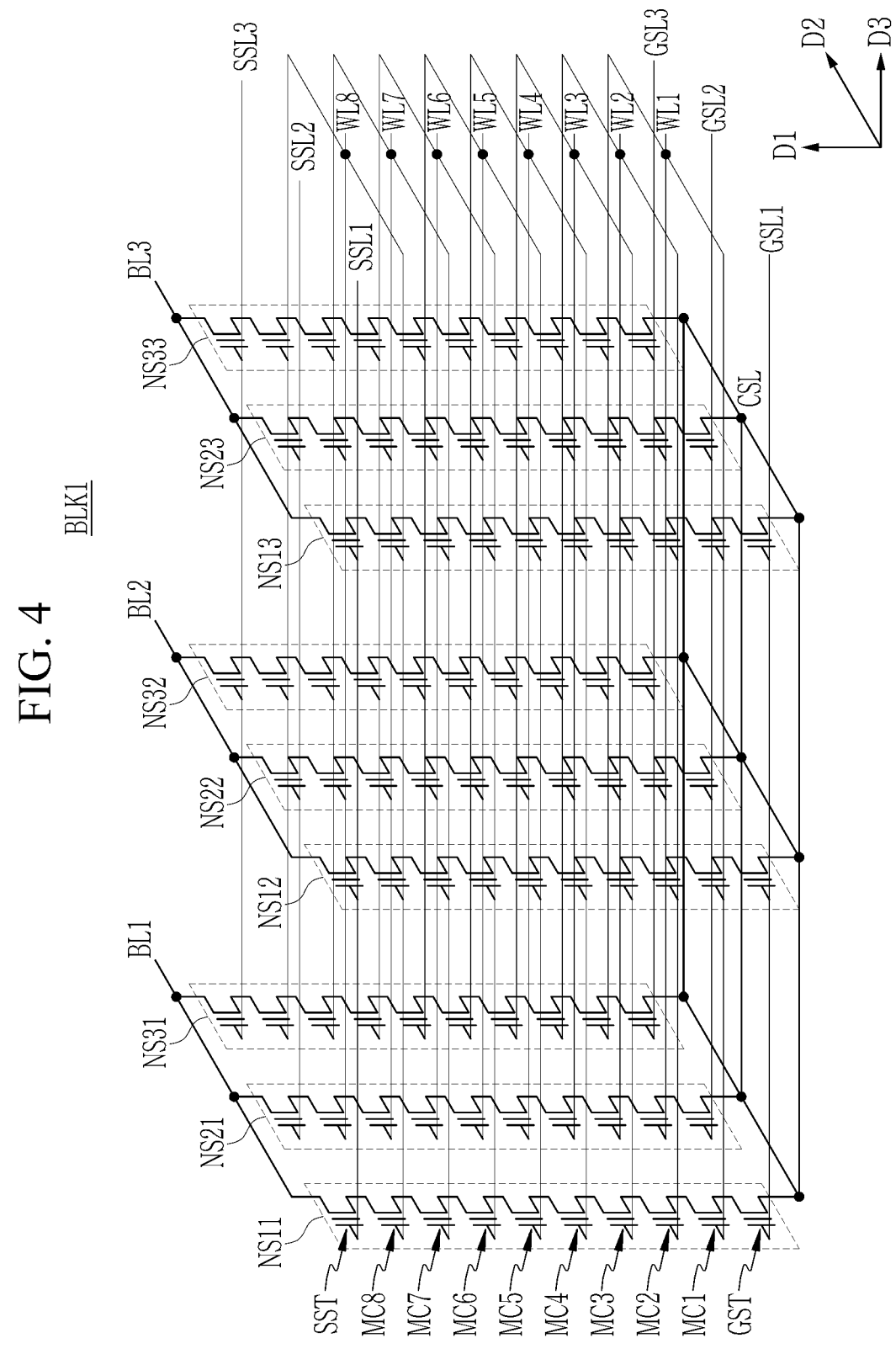
FIG. 4 is a circuit diagram illustrating an equivalent circuit of a memory block of FIG. 3.

FIG. 4 is a circuit diagram illustrating an equivalent circuit of the memory block of FIG. 3.

Referring to FIG. 4, the first memory block BLK1 may be a NAND flash memory with a vertical structure, and each of the memory blocks BLK1-BLKz shown in FIG. 3 may be implemented as shown in FIG. 4.

The first memory block BLK1 may include a plurality of NAND strings NS11-NS33, a plurality of word lines WL1-WL8, a plurality of bit lines BL1-BL3, a plurality of ground select lines GSL1-GSL3, a plurality of string select lines SSL1-SSL3, and a common source line CSL. Here, the number of the NAND strings, the number of the word lines, the number of the bit lines, the number of the ground select lines, and the number of the string select lines may vary depending on an embodiment.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each NAND string (e.g., NS11) may include a string select transistor SST, a plurality of memory cells MC1-MC8, and a ground select transistor GST connected in series.

The NAND strings commonly connected to one bit line may form one column. For example, the NAND strings NS11, NS21, and NS31 commonly connected to the first bit line BL1 may correspond to a first column, the NAND strings NS12, NS22, and NS32 commonly connected to the second bit line BL2 may correspond to a second column, and the NAND strings NS13, NS23, and NS33 commonly connected to the third bit line BL3 may correspond to a third column. A respective cell current Icell flows through each respective NAND string, and the sum of the respective cell currents is the bit line current IBL in the bit line.

The NAND strings connected to one string select line may form one row. For example, the NAND strings NS11, NS12, and NS13 connected to the first string select line SSL1 may correspond to a first row, the NAND strings NS21, NS22, and NS23 connected to the second string select line SSL2 may correspond to a second row, and the NAND strings NS31, NS32, and NS33 connected to the third string select line SSL3 may correspond to a third row.

The string select transistor SST may be connected to corresponding string select lines SSL1, SSL2, and SSL3. The plurality of memory cells MC1-MC8 may be connected to corresponding word lines WL1-WL8, respectively. The ground select transistor GST may be connected to corresponding ground select lines GSL1-GSL3, and the string select transistor SST may be connected to corresponding bit lines BL1-BL3. The ground select transistor GST may be connected to the common source line CSL.

In FIG. 4, word lines (e.g., WL1) of the same height are commonly connected, the string select lines SSL1-SSL3 are separated from each other, and the ground select lines GSL1-GSL3 are also separated from each other. For example, when memory cells that are connected to the first word line WL1 and are included in the NAND strings NS11, NS12, and NS13 corresponding to the first column are programmed, the first word line WL1 and the first string select line SSL1 may be selected. However, the present disclosure is not limited thereto, and the ground select lines GSL1-GSL3 may be commonly connected.

The plurality of memory cells may be read or programmed by a voltage provided by at least one of the bit line BL and the word line WL.

When the string select transistor SST0 is turned on by a signal transferred through the string select line SSL, a cell string (CS0) may be connected to a corresponding bit line among the plurality of bit lines BL. The cell string (CS0) may be connected to the common source line CSL through the ground select transistor GST0 driven by the ground select line GSL.

Remaining cell strings (CS1-CSn−1) may also be configured in the same way as the cell string (CS0), and may be connected to a corresponding bit line among the plurality of bit lines BL. The cell string (CS1-CSn−1) may also be connected to the common source line CSL in the same way as the cell string (CS0).

The row decoder 320 may transfer a word line voltage VWL corresponding to the operating mode to the word line of a selected memory block. Specifically, during a program operation, the row decoder 320 may apply a program voltage and a verification voltage to the selected word line, and may apply a pass voltage to an unselected word line. During the read operation, the row decoder 320 may apply a read voltage (VWL) to the selected word line among the plurality of word lines WL, may apply a turn-on voltage to a selected ground select line GSL, and may apply a turn-off voltage that is a ground voltage to an unselected ground select line GSL. A read pass voltage capable of always turning on the memory cell regardless of a program state of the memory cell may be applied to an unselected word line WL.

During the program operation, the page buffer circuit 330 may apply a bit line voltage corresponding to data to be programmed to the plurality of bit lines BL of the memory cell array 310. During the read operation or a verification read operation, the page buffer circuit 330 may sense data stored in a selected memory cell through the bit line BL.

Figure 5:
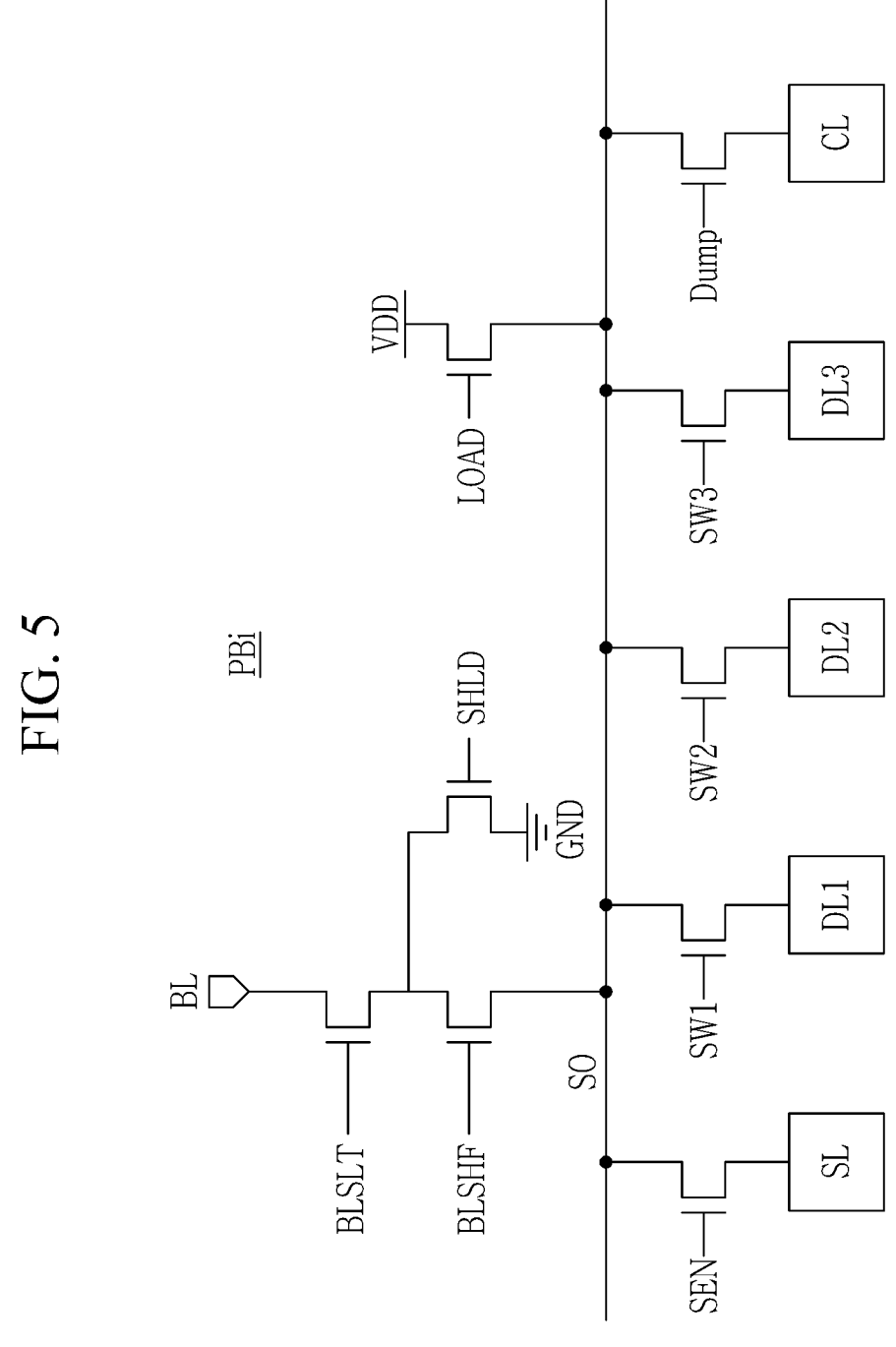
FIG. 5 is a view illustrating a page buffer according to an embodiment of the present disclosure.

FIG. 5 is a view illustrating the page buffer according to an embodiment of the present disclosure.

Specifically, FIG. 5 is a view illustrating one page buffer PBi among the plurality of page buffers within the page buffer circuit 330 of FIG. 3. The i is a positive integer less than or equal to n. As shown in FIG. 5, the page buffer PBi may be connected to the memory cells of the cell string through the bit line BLi among the plurality of bit lines BL.

The page buffer PBi may include transistors for supplying a power supply voltage VDD and a memory cell voltage to the bit line BLi. The page buffer PBi may receive control signals BLSLT, BLSHF, SHLD, and LOAD for controlling the transistors from the control circuit 360 as the sensing control signal CTRL_SO of FIG. 3. A corresponding bit line BLi among the plurality of bit lines BL may be selected by the bit line select signal BLSLT. A connection between the bit line BLi and a sensing node SO may be controlled by the bit line shut-off signal BLSHF. The bit line BLi and a ground may be connected by the shielding signal SHLD. The power supply voltage VDD and the sensing node SO may be connected by the load signal LOAD. The sensing node SO may be precharged and developed in response to the control signals BLSLT, BLSHF, SHLD, and LOAD. In this case, the power supply voltage VDD of the page buffer PBi may be a bit line voltage (VBL) defined by the control circuit 360.

Additionally, the page buffer PBi may include latches SL, DL1, DL2, DL3, and CL and transistors for connecting the latches SL, DL1, DL2, DL3, and CL and the sensing node SO. Data of the sensing node SO may be latched in the latches SL, DL1, DL2, DL3, and CL in response to switching signals SEN, SW1, SW2, SW3, and Dump.

During the read operation, the sensing latch SL may sense a sensing result of data stored in the memory cell to store the sensed sensing result as a latch value.

The plurality of data latches DL1, DL2, and DL3 may be used to store a value sensed by the sensing latch SL, or may be used to store data input from the outside during the program operation. Although three data latches are shown in FIG. 5, the present disclosure is not limited thereto, and the number of data latches may vary depending on an embodiment.

Additionally, the cache latch CL may receive the sensing result of data stored in the memory cell from the sensing latch SL to output the received sensing result to the outside.

The page buffer PBi may control the SO discharge time for sensing data stored in the memory cell based on the sensing control signal CTRL_SO received from the control circuit 360. Specifically, the sensing node SO may be precharged with the power supply voltage VDD by the load signal LOAD, and the bit line BLi to which the memory cell selected by the bit line select signal BLSLT and the bit line shut-off signal BLSHF is connected may be connected to the sensing node SO. The sensing node SO may be developed by a cell current Icell of the memory cell flowing through the bit line BLi. The cell current Icell flowing through the memory cell may be a current flowing through the memory cell as the word line voltage VWL is applied to a gate of a selected memory cell. For example, as shown in FIG. 4, sources and drains of the memory cell array 310 may include a series of memory transistors connected in a daisy-chain type. Each memory transistor within the chain may include a charge storage element that stores a given amount of charge to indicate an intended memory state. Accordingly, the cell current Icell may change based on data value stored in the memory cell. In this case, the SO discharge time may be a time from when the sensing node SO is precharged to when a current of the sensing node SO is measured.

During the read operation, the page buffer PBi may precharge the sensing node SO, and may monitor the current of the sensing node SO changed by the cell current Icell to determine a logical state (or whether the memory cell is an on-cell or an off-cell) of data stored in the selected memory cell. The page buffer PBi may sense the data stored in the selected memory cell by sensing a current or a voltage of the sensing node SO. Specifically, a threshold voltage of the memory cell may be determined by monitoring the sensing node of the page buffer PBi for a specific time (e.g., the SO discharge time) based on a selected word line voltage level, so that whether the memory cell is the on-cell or the off-cell is determined. In other words, the threshold voltage of the memory cell may be defined based on the word line voltage level. For example, if the memory cell is the on-cell (i.e., the data stored in the memory cell is 0), the current of the sensing node SO may be maintained during the SO discharge time, and if the memory cell is the off-cell (i.e., the data stored in the memory cell is 1), the current of the sensing node SO may decrease during the SO discharge time.

During the program operation, the page buffer PBi may apply a bit line voltage corresponding to data to be programmed through a selected bit line BLi. Specifically, the page buffer PBi may set up or precharge the sensing node SO. Thereafter, the page buffer PBi may store data to be programmed in the latch, and may precharge the bit line BLi. Next, the page buffer PBi may transfer the data stored in the latch to the memory cell array 310 through the bit line BLi.

In an embodiment, operating information required for a memory operation may be stored within the memory device 300. For example, the memory device 300 may store the operating information in the memory cell array 310, and may use an electrical fuse (E-Fuse) method in which the operating information corresponding to the command CMD received from the memory controller 200 of FIG. 1 is read from the memory cell array 310 when a memory chip operates so that information is transferred by turning a switch on or off. The operating information stored in an E-Fuse form may include DC trim information for a chip operation, option information, voltage application time information, the SO discharge time (or a SO develop time) according to a type of the read mode, or the like. The operating information may be stored in advance in a test step for a specific region of the memory cell. On the other hand, the page buffer PBi may modify a predetermined SO discharge time based on the sensing control signal CTRL_SO. Referring again to FIG. 3, the voltage generator 350 may generate the word line voltage VWL that will be supplied to each word line WL and a voltage that will be supplied to a bulk (e.g., a well region) where the memory cells are formed based on a power supply PWR received from the outside and the voltage control signal CTRL_vol received from the control circuit 360.

From a time when the voltage generator 350 applies a voltage to the cell selected through the row decoder 320, a current flowing through the bit line BL connected to the cell may change depending on a state of data stored in the cell.

Figure 6:
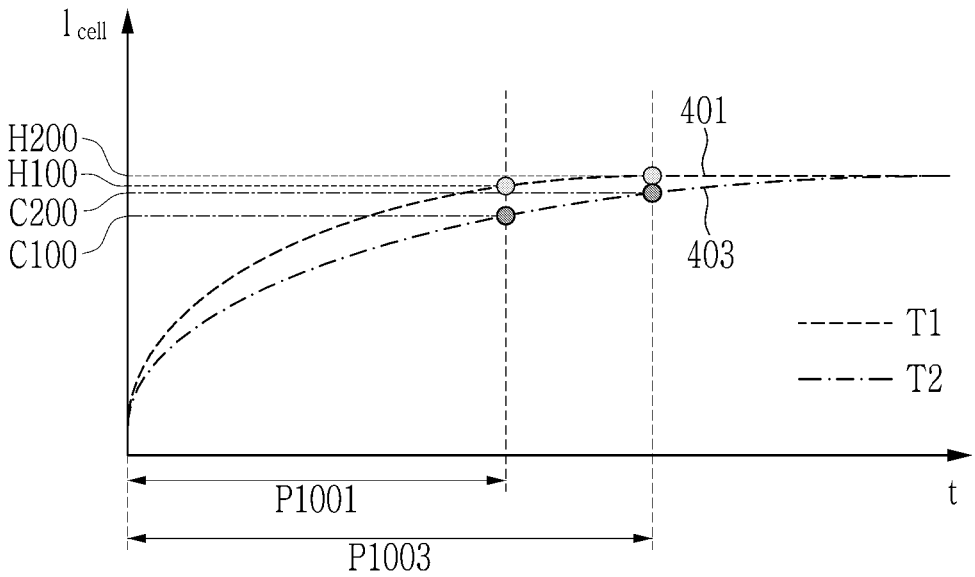
FIG. 6 is a graph showing a cell current of a memory cell according to an embodiment.

FIG. 6 is a graph showing the cell current of the memory cell according to an embodiment.

A first graph 401 is a graph showing a change in the cell current Icell over time when the memory device 300 has a first temperature T1, and a second graph 403 is a graph showing the change in the cell current Icell over time when the memory device 300 has a second temperature T2. In this case, the first temperature T1 may be a higher temperature than the second temperature T2.

As shown in FIG. 6, as a temperature of the memory device 300 decreases, a cell current flowing through the memory cell may decrease. Additionally, a degree to which the cell current Icell increases may vary depending on the temperature of the memory device 300. At the same time, the cell current Icell at the second temperature T2 that is a low temperature may be smaller than the cell current Icell at the first temperature T1 that is a high temperature.

On the other hand, when the memory device 300 operates in the fast read mode, the page buffer circuit 330 may measure the current of the sensing node SO after a first period P1001. In this case, if the memory device 300 has the first temperature T1, the cell current Icell may have a first value H100. If the memory device 300 has the second temperature T2, the cell current Icell may have a first value C100.

When the memory device 300 operates in the normal read mode, the page buffer circuit 330 may measure the current of the sensing node SO after a second period P1003 that is longer than the first period P1001. In this case, if the memory device 300 has the first temperature T1, the cell current Icell may have a second value H200. If the memory device 300 has the second temperature T2, the cell current Icell may have a second value C200. On the other hand, since the cell current of the memory cell flows to the sensing node SO through the bit line BLi, the current of the sensing node may have the same value as the cell current Icell unless otherwise stated below.

In summary, data of the memory cell sensed by the page buffer PBi may be affected by the read mode of the memory device 300 and the temperature of the memory device 300.

As the cell current Icell decreases, the current of the sensing node SO may be slowly discharged. Accordingly, even when the memory cell is the on-cell, a probability that the page buffer PBi senses the memory cell as the off-cell may increase. To compensate for the change in the cell current Icell according to a temperature change in the memory device 300 and to compensate for a change in the current of the sensing node SO according to the temperature and the read mode, the memory device 300 may adjust the sensing parameters.

On the other hand, for convenience of description, the following description assumes a case where the bit line voltage or the word line voltage is lower than a target bit line voltage or a target word line voltage so that the cell current Icell is insufficient. However, the present disclosure is not limited thereto, and the present disclosure may include a case where the bit line voltage or the word line voltage is higher than the target bit line voltage or the target word line voltage so that the cell current Icell excessively flows or the cell current Icell increases because the temperature of the memory device 300 is high. In this case, the memory device 300 may appropriately reduce the word line voltage, the bit line voltage, and the SO discharge time to compensate for the cell current Icell that varies when the temperature is low.

Figure 7:
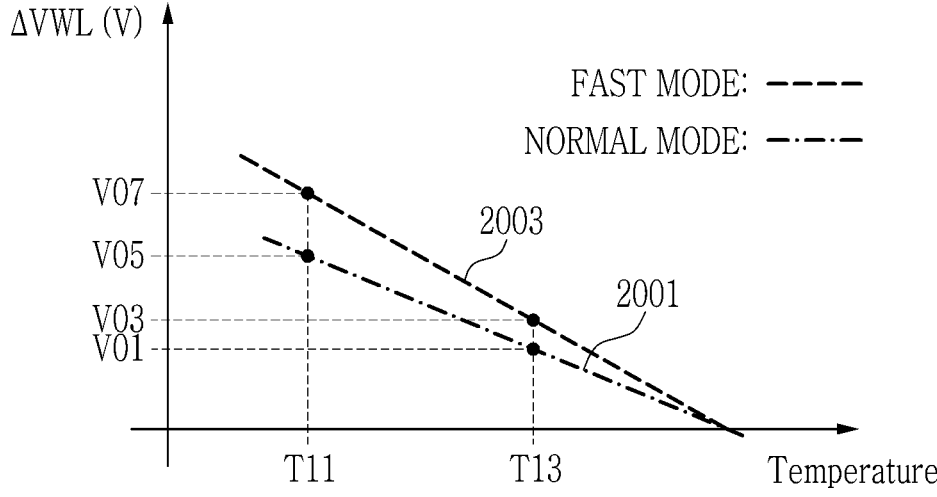
FIG. 7 is a graph showing a word line compensation voltage according to temperature.

FIG. 7 is a graph showing a word line compensation voltage according to temperature.

A relationship between the word line voltage and the cell current is as follows.

$$Icell = A(Vgs - Vth) + B \qquad \text{(Equation 1)}$$

In Equation 1, Vgs is a gate-source voltage, Vth is a cell threshold voltage, and A and B are constants.

As shown in Equation 1, as a voltage (i.e., a gate voltage) applied to the word line increases, the cell current Icell may increase.

A first graph 2001 is a graph showing the word line compensation voltage $\Delta VWL$ according to the temperature when the memory device 300 operates in the normal read mode. A second graph 2003 is a graph showing the word line compensation voltage $\Delta VWL$ according to the temperature when the memory device 300 operates in the fast read mode. The memory device 300 may apply a voltage obtained by adding the word line compensation voltage $\Delta VWL$ to the word line voltage as the word line voltage VWL to the selected word line.

When the memory device 300 reads data in one read mode, the cell current Icell of the memory cell at a low temperature may be less than the cell current Icell of the memory cell at a high temperature. For example, when the memory device 300 reads data in the fast read mode, the cell current Icell at a first temperature T11 may be less than the cell current at a second temperature T13. As shown in FIG. 7, the word line compensation voltage $\Delta VWL$ that allows the cell current Icell of the memory device 300 at the first temperature T11 to have the same value as the cell current Icell of the memory cell at a predetermined temperature may be a fourth voltage V07. The word line compensation voltage $\Delta VWL$ that allows the cell current Icell of the memory device 300 at the second temperature T13 to have the same value as the cell current Icell of the memory cell at a predetermined temperature may be a second voltage V03. In this case, a value of the second voltage V03 may be smaller than a value of the fourth voltage V07.

When the memory device 300 reads data at the same temperature, a current value of the sensing node when data are read in the fast read mode may be less than a current value of the sensing node when data are read in the normal read mode. For example, a current value of the sensing node when the memory device 300 operates in the fast read mode at the first temperature T11 may be less than a current value of the sensing node when it operates in the normal read mode at the first temperature T11. Accordingly, the word line compensation voltage $\Delta VWL$ that allows the current value of the sensing node when the memory device 300 operates in the fast read mode at the first temperature T11 to have the same value as a current of the sensing node operating in the fast read mode at a predetermined temperature may be the fourth voltage V07. The word line compensation voltage $\Delta VWL$ that allows the current value of the sensing node when the memory device 300 operates in the normal read mode at the first temperature T11 to have the same value as a current of the sensing node operating in the normal read mode at a predetermined temperature may be a third voltage V05. The third voltage V05 may be smaller than the fourth voltage V07.

In summary, the word line compensation voltage $\Delta VWL$ may have the largest value when data are read in the fast read mode at a low temperature. A size of the word line compensation voltage $\Delta VWL$ may become larger as the temperature of the memory device 300 decreases and the memory device 300 reads data using a faster read mode.

Figure 8:
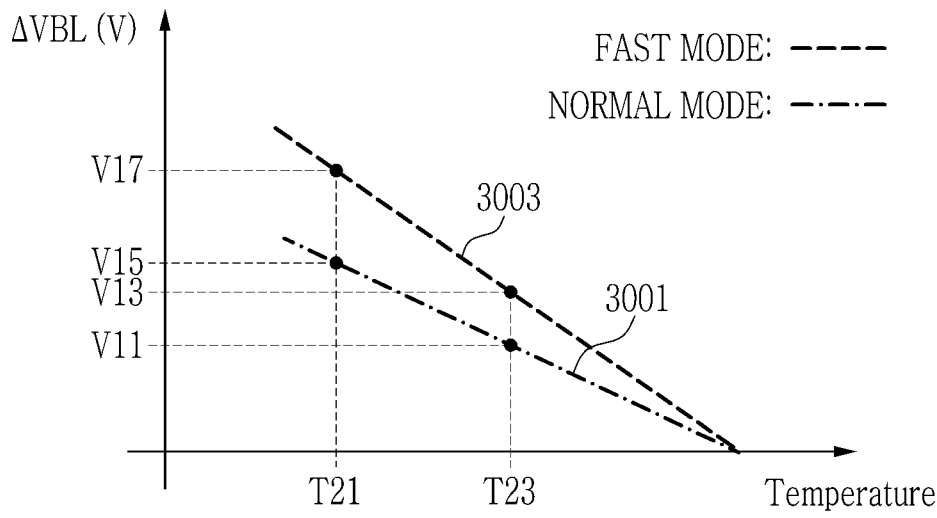
FIG. 8 is a graph showing a bit line compensation voltage according to temperature.

FIG. 8 is a graph showing a bit line compensation voltage according to temperature.

A relationship between the bit line voltage and the cell current Icell is as follows.

$$Icell = VBL/Rcell \qquad \text{(Equation 2)}$$

In Equation 2, VBL is the bit line voltage, and Rcell is a cell string resistance.

As shown in Equation 2, as the bit line voltage (VBL) increases, the cell current Icell may increase.

A first graph 3001 is a graph showing the bit line compensation voltage $\Delta VBL$ according to the temperature when the memory device 300 operates in the normal read mode. A second graph 3003 is a graph showing the bit line compensation voltage $\Delta VBL$ according to the temperature when the memory device 300 operates in the fast read mode. The memory device 300 may apply a voltage obtained by adding the bit line compensation voltage ΔVBL to the bit line voltage as the power supply voltage VDD of FIG. 5 to the bit line BL.

As described above, when the memory device 300 reads data in one read mode, the cell current Icell of the memory cell at a low temperature may be less than the cell current Icell of the memory cell at a high temperature. Accordingly, when the memory device 300 reads data in the fast read mode, the bit line compensation voltage ΔVBL required at a first temperature T21 may be a fourth voltage V17, and the bit line compensation voltage ΔVBL required at a second temperature T23 may be a second voltage V13 that is smaller than the fourth voltage V17.

A current value of the sensing node when the memory device 300 reads data in the fast read mode at the same temperature may be less than a current value of the sensing node when data are read in the normal read mode. For example, a current value of the sensing node when the memory device 300 operates in the fast read mode at the first temperature T21 may be less than a current value of the sensing node when it operates in the normal read mode at the first temperature T21. Accordingly, the bit line compensation voltage ΔVBL that allows the current value of the sensing node when the memory device 300 operates in the fast read mode at the first temperature T21 to have the same value as a current of the sensing node operating in the fast read mode at a predetermined temperature may be the fourth voltage V17. The bit line compensation voltage ΔVBL that allows the current value of the sensing node when the memory device 300 operates in the normal read mode at the first temperature T21 to have the same value as a current of the sensing node operating in the normal read mode at a predetermined temperature may be a third voltage V15. The third voltage V15 may be smaller than the fourth voltage V17.

In summary, the bit line compensation voltage ΔVBL may have the largest value when data are read in the fast read mode at a low temperature. A size of the bit line compensation voltage ΔVBL may become larger as the temperature of the memory device 300 decreases and the memory device 300 reads data using a faster read mode.

Figure 9:
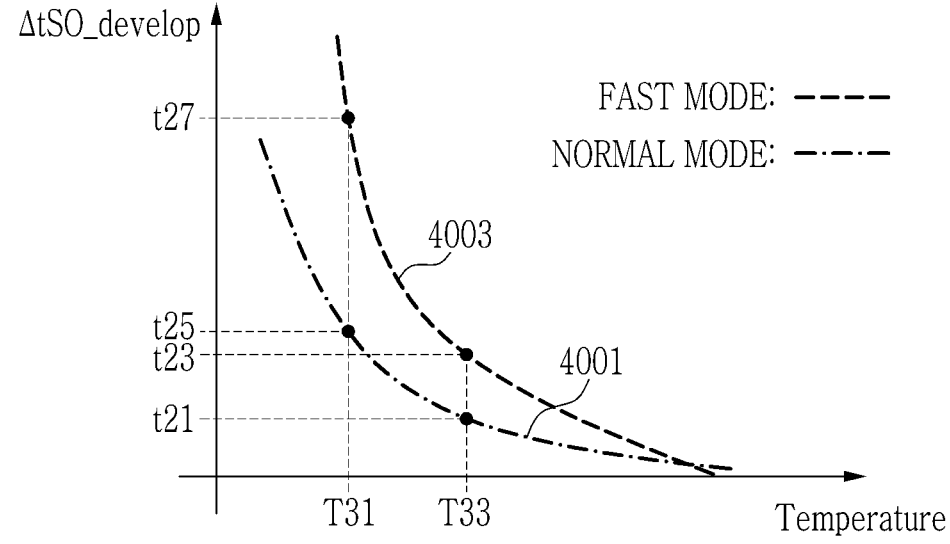
FIG. 9 is a graph showing an SO discharge compensation time according to temperature.

FIG. 9 is a graph showing an SO discharge compensation time according to temperature.

A relationship between the SO discharge time and the cell current is as follows.

$$Icell = (Cso * Vso)/t_{so\_develop} \qquad \text{(Equation 3)}$$

In Equation 3, $t_{SO\_develop}$ is the SO discharge time, Cso is a capacitor of the sensing node, and Vso is a voltage change amount of the sensing node during the SO discharge time.

As shown in Equation 3, as the SO discharge time ($t_{SO\_develop}$) becomes longer, the cell current Icell required to read data may decrease. That is, as the cell current Icell decreases, a required SO discharge time ($t_{SO\_develop}$) may increase.

A first graph 4001 is a graph showing the SO discharge compensation time ΔtSO_develop according to the temperature when the memory device 300 operates in the normal read mode. A second graph 4003 is a graph showing the SO discharge compensation time ΔtSO_develop according to the temperature when the memory device 300 operates in the fast read mode.

As described above, when the memory device 300 reads data in one read mode, the cell current Icell of the memory cell at a low temperature may be less than the cell current Icell of the memory cell at a high temperature. It may take a longer time for the memory cell to discharge depending on data of the memory cell when the cell current Icell of the memory cell is low compared with when the cell current Icell of the memory cell is high. Accordingly, it is necessary to set a longer time required for the memory cell to discharge according to the data. Therefore, a larger SO discharge compensation time ΔtSO_develop when the cell is read at a low temperature compared with when the cell is read at a high temperature may be set so that a time during which the cell current Icell may be discharged is increased. For example, when the memory device 300 reads data in the fast read mode, the SO discharge compensation time ΔtSO_develop required at a first temperature T31 may be a fourth time t27, and the SO discharge compensation time ΔtSO_develop required at the second temperature T23 may be a second time t23 that is less than the fourth time t27.

The cell current Icell of the memory cell when the memory device 300 reads data in the fast read mode at the same temperature may be less than the cell current Icell of the memory cell when data are read in the normal read mode. When the memory cell is the on-cell, a time during which the cell current Icell may be discharged may be insufficient when the cell is read in the fast read mode compared with when the cell is read in the normal read mode. Accordingly, the page buffer PBi may incorrectly read the memory cell as the off-cell. Therefore, a larger SO discharge compensation time ΔtSO_develop when the memory device 300 reads data in the fast read mode compared with when data are read in the normal read mode may be set so that a time during which the cell current Icell may be discharged is increased. For example, the cell current Icell when the memory device 300 operates in the fast read mode at the first temperature T31 may be less than the cell current Icell when it operates in the normal read mode at the first temperature T31. Accordingly, the SO discharge compensation time ΔtSO_develop required when the memory device 300 operates in the fast read mode at the first temperature T31 may be the fourth time t27, and the SO discharge compensation time ΔtSO_develop required when the memory device 300 operates in the normal read mode at the first temperature T31 may be a third time t25 that is less than the fourth time t27.

As described in FIGS. 7 to 9, the memory device 300 may set in advance compensation values of a plurality of sensing parameters (e.g., the word line voltage VWL, the bit line voltage (VBL), and the SO discharge time (tSO_develop)) for compensating for the cell current that changes depending on the temperature and the read mode. For example, the memory device 300 may store the compensation value of each of the plurality of sensing parameters according to a difference between a current temperature and a predetermined reference temperature of the memory device 300. The memory device 300 may determine the compensation value of each of the plurality of sensing parameters based on the command CMD and the address ADDR from the memory controller 200 and the temperature TEMP from the temperature sensor 150, and may read data from the memory cell array based on the compensation value.

In an embodiment, the word line voltage VWL and the bit line voltage (VBL) may be stored in the control circuit 360 of the memory device 300. On the other hand, the SO discharge time (tSO_develop) may be stored in the memory cell array 310 of the memory device 300.

Figure 10:
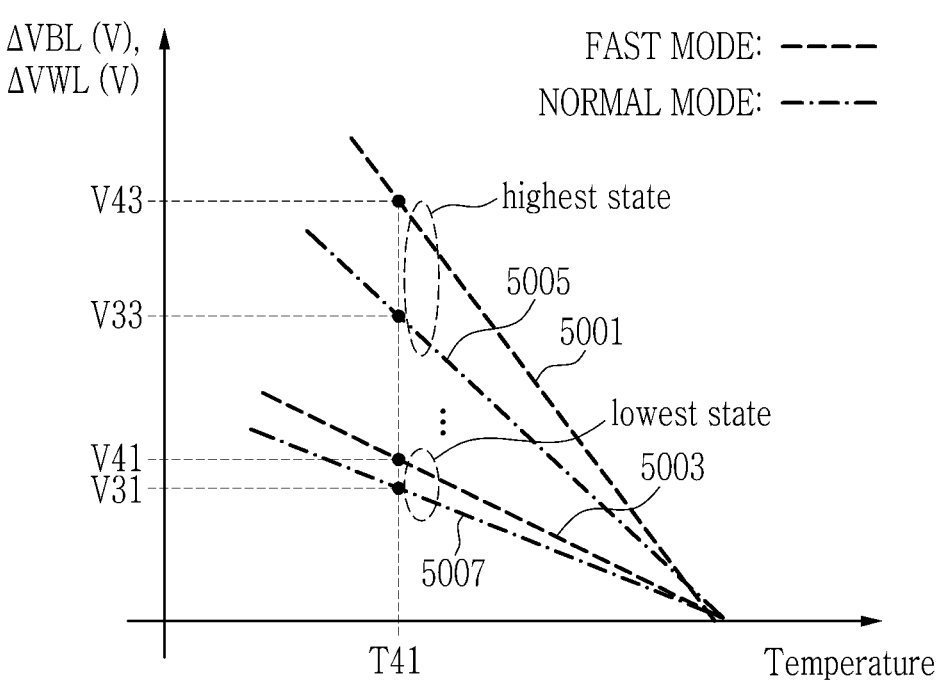
FIG. 10 is a graph showing a word line compensation voltage and a bit line compensation voltage according to temperature.

FIG. 10 is a graph showing a word line compensation voltage and a bit line compensation voltage according to temperature. FIG. 10 indicates a family of fast and normal mode curve pairs for different states.

A relationship between the bit line voltage and a sensing node current (IBL) is as follows.

$$IBL \propto (Vgs - Vth) \qquad \text{(Equation 4)}$$

In Equation 4, the bit line current is proportional to a difference between the applied word line voltage and a threshold for a particular memory cell, when that difference is greater than zero.

The memory device 300 may control a connection between the bit line and the sensing node SO by the bit line shut-off signal BLSHF, and may read data according to a voltage or a current of the sensing node SO connected to the bit line corresponding to the selected memory cell. Therefore, in order to accurately read data from the memory cell, it is necessary to compensate for a change in the cell current and compensate for a change in the sensing node current.

On the other hand, the sensing node current (i.e., a bit line current) of the selected memory cell may be affected depending on a relative state of adjacent cells with respect to a state of the selected memory cell. For example, if the word line voltage for reading upper state data of the selected memory cell is applied, a probability that adjacent memory cells turn on may increase, and a lot of current may flow to adjacent bit lines connected to the adjacent memory cells. A current flowing through the bit line connected to the selected memory cell may be affected by a current flowing through the adjacent bit lines depending on a coupling phenomenon between the adjacent bit lines and a selected bit line. Therefore, in order to compensate for the change in the sensing node current, it may be necessary to separate the sensing parameters depending on the state of the selected memory cell.

In an embodiment, a state of the memory cell to be read for each page may be preset in the memory device 300.

If the memory cell is a multi-level cell (MLC), the memory cell may have an erase state (E), a first program state (P1), a second program state (P2), and a third program state (P3) in an order in which the threshold voltage increases.

When the memory cell having the third program state (P3) that is a high state is read, the memory cells connected to the adjacent bit lines may have a relatively low threshold voltage. As the memory cell has a high state, a voltage of the bit line may become lower due to the coupling phenomenon caused by the adjacent bit lines. Related to Equation 4, the VBLSHF voltage may have a fixed value so that the bit line current (IBL) increases. Accordingly, a voltage of the memory cell may be quickly discharged, and a possibility of reading the memory cell that is the off-cell as the on-cell may increase in the page buffer PBi.

On the other hand, when the memory cell in a lower state is read, the bit line current (IBL) may decrease. Accordingly, the voltage of the memory cell may be slowly discharged, and a possibility of reading the memory cell that is the on-cell as the off-cell may increase in the page buffer PBi.

A first graph 5001 is a graph showing the bit line compensation voltage ΔVBL and the word line compensation voltage ΔVWL according to the temperature when the memory device 300 reads the memory cell having the lower state (e.g., the third program state) in the fast read mode. A second graph 5003 is a graph showing the bit line compensation voltage ΔVBL and the word line compensation voltage ΔVWL according to the temperature when the memory device 300 reads the memory cell having an upper state (e.g., the first program state) in the fast read mode. On the other hand, in FIG. 10, the bit line compensation voltage ΔVBL and the word line compensation voltage ΔVWL are shown together on one y-axis, but the bit line compensation voltage ΔVBL and the word line compensation voltage ΔVWL may not have the same value.

As described above, when the memory cell in the upper state is read, a lot of bit line current (IBL) may flow, so that it is necessary to apply a smaller bit line compensation voltage ΔVBL and word line compensation voltage ΔVWL when the memory cell in the upper state is read compared with when the memory cell in the lower state is read. Accordingly, the memory device 300 may reduce the bit line current by setting the smaller bit line compensation voltage ΔVBL and word line compensation voltage ΔVWL when the memory cell in the upper state is read. The bit line compensation voltage ΔVBL and the word line compensation voltage ΔVWL that need to be compensated according to the temperature of the memory device 300 and the state of the selected memory cell may be set in advance.

For example, the bit line compensation voltage ΔVBL and the word line compensation voltage ΔVWL required when the memory device 300 reads lower state data in the fast read mode at a first temperature T41 may be a second value V43. The bit line compensation voltage ΔVBL and the word line compensation voltage ΔVWL required when the memory device 300 reads upper state data in the fast read mode at the first temperature T41 may be a first value V41 that is less than the second value V43.

A third graph 5005 is a graph showing the bit line compensation voltage ΔVBL and the word line compensation voltage ΔVWL according to the temperature when the memory device 300 reads the memory cell having the lower state (e.g., the third program state) in the normal read mode. A fourth graph 5003 is a graph showing the bit line compensation voltage ΔVBL and the word line compensation voltage ΔVWL according to the temperature when the memory device 300 reads the memory cell in the upper state (e.g., the first program state) in the normal read mode.

For example, the bit line compensation voltage ΔVBL and the word line compensation voltage ΔVWL required when the memory device 300 reads the lower state data in the normal read mode at the first temperature T41 may be a second value V33 that is less than the second value V43. The bit line compensation voltage ΔVBL and the word line compensation voltage ΔVWL required when the memory device 300 reads the upper state data in the normal read mode at the first temperature T41 may be a first value V31 that is less than the first value V41.

Figure 11:
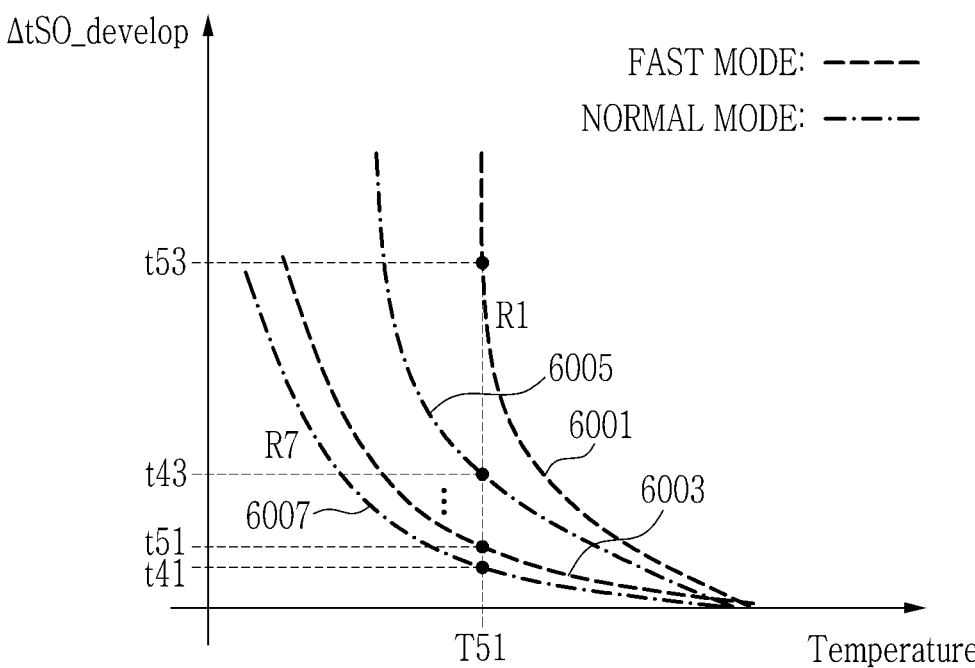
FIG. 11 is a graph showing an SO discharge compensation time according to temperature.

FIG. 11 is a graph showing an SO discharge compensation time according to temperature.

A first graph 6001 is a graph showing the SO discharge compensation time ΔtSO_develop according to the temperature when the memory device 300 reads the memory cell having the upper state in the fast read mode. A second graph 6003 is a graph showing the SO discharge compensation time ΔtSO_develop according to the temperature when the memory device 300 reads the memory cell having the lower state in the fast read mode.

As described above, when the memory cell having the upper state is read, a smaller bit line current (IBL) may flow. Accordingly, a possibility of reading the memory cell that is the off-cell as the on-cell may increase. If a memory cell current is low, it may require a longer time to discharge the memory cell current when the memory cell current is low compared with when the memory cell current is high. Accordingly, the memory device 300 may set a longer SO discharge time (tSO_levelop) when the memory cell in a high state is read compared with when the memory cell in a low state is read. The SO discharge compensation time ΔtSO_develop that has to be compensated according to the temperature of the memory device 300 and the state of the selected memory cell may be set in advance.

For example, when the memory device 300 reads the memory cell having the upper state in the fast read mode, the SO discharge compensation time ΔtSO_develop required at a first temperature T51 may be a second time t53, and when the memory device 300 reads the memory cell having the lower state in the fast read mode, the SO discharge compensation time ΔtSO_develop required at the first temperature T51 may be a first time t51 shorter than the second time t53.

A third graph 6005 is a graph showing the SO discharge compensation time ΔtSO_develop according to the temperature when the memory device 300 reads the memory cell having the upper state in the normal read mode. A fourth graph 6007 is a graph showing the SO discharge compensation time ΔtSO_develop according to the temperature when the memory device 300 reads the memory cell having the low state in the normal read mode.

For example, the SO discharge compensation time ΔtSO_develop required when the memory device 300 reads the upper state data in the normal read mode at the first temperature T41 may be a second time t43 that is less than the second time t53. The SO discharge compensation time ΔtSO_develop required when the memory device 300 reads the lower state data in the normal read mode at the first temperature T41 may be a first time t41 that is less than the first time t51.

Figure 12:
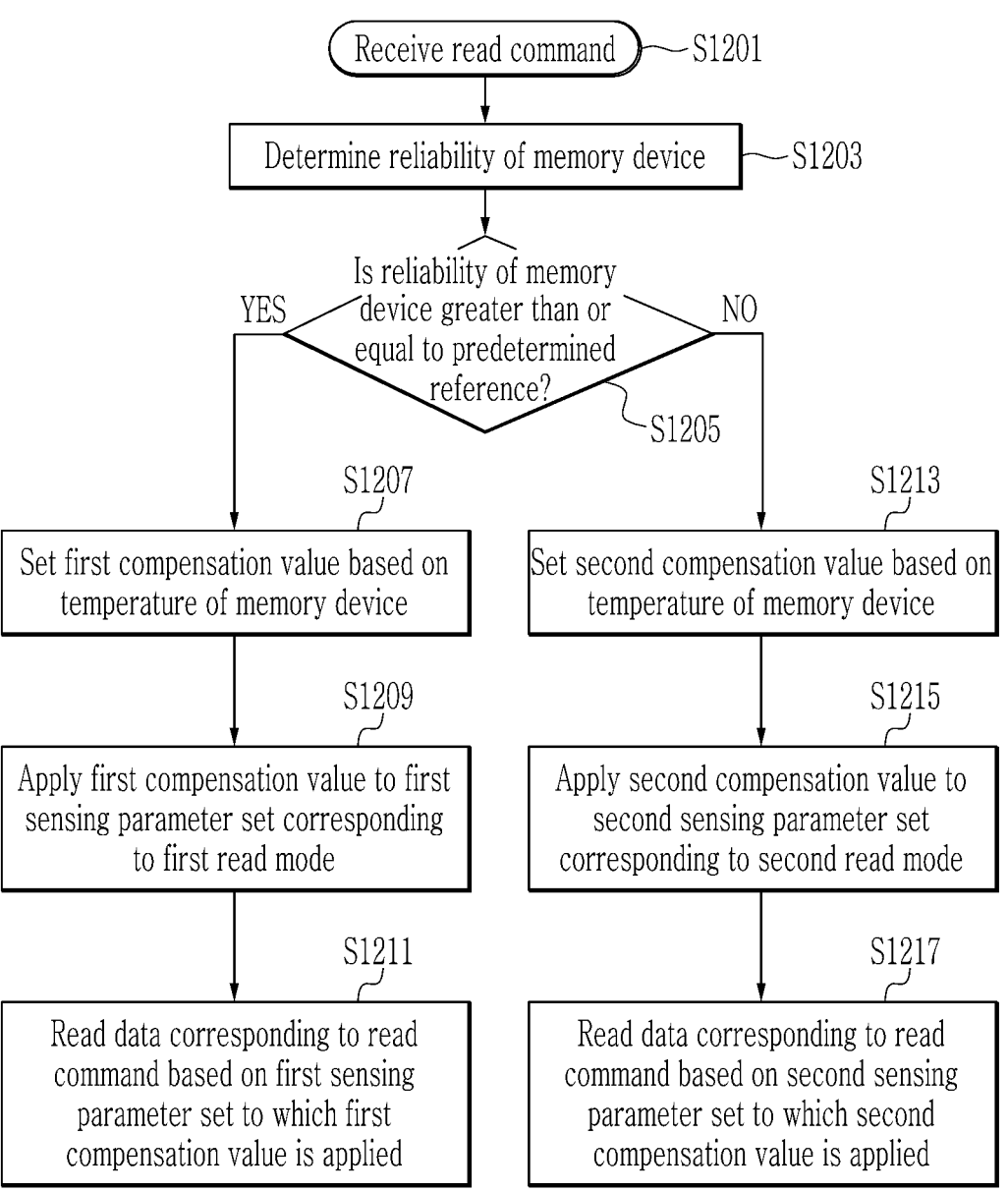
FIG. 12 is a flowchart showing an operation in which the memory system reads data according to an embodiment.

FIG. 12 is a flowchart showing an operation in which the memory system reads data according to an embodiment.

First, the memory system 10 receives the read command from the host (S1201).

The memory controller 200 determines reliability of the memory device 300 (S1203).

In an embodiment, the memory controller 200 may determine the reliability of the memory device 300 based on the address of the cell to be accessed, the retention time of the memory device 300, the program/erase count of the memory device 300, and the like.

The memory controller 200 determines whether the reliability of the memory device 300 is greater than or equal to a predetermined reference (or a predetermined reference value) (S1205).

If the reliability of the memory device 300 is greater than or equal to the predetermined reference, the memory controller 200 sets a first compensation value based on the temperature of the memory device 300 (S1207).

If the reliability of the memory device 300 is greater than or equal to the predetermined reference, the memory controller 200 may read data in a first read mode. A sensing parameter set required to read the data depending on the first read mode may be preset. The sensing parameter set may include the word line voltage, the bit line voltage, and the SO discharge time. For example, the word line voltage may be set to a first voltage level, the bit line voltage may be set to a second voltage level, and the SO discharge time may be set to a third time.

On the other hand, if there is a difference between the temperature of the memory device 300 when the write operation is performed and the temperature of the memory device 300 when the read operation is performed, the memory controller 200 may apply a predetermined offset to the word line voltage. For example, when the write operation is performed on the memory device 300 at 50° C. to 85° C. and the read operation is performed on the memory device 300 at 25° C. to 50° C., the memory controller 200 may apply an offset of a first voltage to the word line voltage. In the present specification, applying the offset may mean setting a value obtained by adding the offset to the word line voltage as a word line voltage. That is, a value obtained by adding the first voltage to the first voltage level may be set as the word line voltage.

In an embodiment, the first compensation value may be set based on the read mode and the temperature of the memory device 300. For example, the first compensation value may be set based on a difference between the reference temperature and the current temperature of the memory device 300. If the reference temperature of the memory device 300 is 85° C. and the current temperature of the memory device 300 is 80° C., there is a difference of −5° C. compared with the reference temperature. If the temperature of the memory device 300 differs by −5° C. compared with the reference temperature in the case of the first read mode, the compensation value for each sensing parameter may be set in advance. In this case, predetermined compensation values may be stored in the memory device 300. Specifically, the compensation value for the word line voltage may be preset to a fourth voltage, the compensation value for the bit line voltage may be preset to a fifth voltage, and the compensation value for the SO discharge time may be preset to a sixth time. Here, the fourth voltage, the fifth voltage, or the sixth time may have a positive value as well as a negative value.

The memory device 300 applies the first compensation value to a first sensing parameter set corresponding to the first read mode (S1209).

The memory device 300 may apply the compensation value corresponding to each sensing parameter to each sensing parameter corresponding to the first read mode. Here, applying the compensation value may mean adding the compensation value corresponding to each sensing parameter to each sensing parameter. For example, the word line voltage may add the fourth voltage to the first voltage level, the bit line voltage may add the fifth voltage to the second voltage level, and the SO discharge time may add the sixth time to the third time.

The memory device 300 reads data corresponding to the read command based on the first sensing parameter set to which the first compensation value is applied (S1211).

Specifically, the memory device 300 may read data using the word line voltage that adds the fourth voltage to the first voltage level, the bit line voltage that adds the fifth voltage to the second voltage level, and the SO discharge time that adds the sixth time to the third time.

If the reliability of the memory device 300 is less than the predetermined reference, the memory controller 200 sets a second compensation value based on the temperature of the memory device 300 (S1213).

If the reliability of the memory device 300 is less than the predetermined reference, the memory controller 200 may read data in a second read mode. Sensing parameters required to read the data depending on the second read mode may be preset. For example, the word line voltage may be set to another first voltage level, the bit line voltage may be set to another second voltage level, and the SO discharge time may be set to another third time.

The memory device 300 applies the second compensation value to a second sensing parameter set corresponding to the second read mode (S1215).

The memory device 300 may apply the compensation value corresponding to each sensing parameter to each of the sensing parameters corresponding to the second read mode. Here, applying the compensation value may mean adding the compensation value corresponding to each sensing parameter to each sensing parameter. For example, the word line voltage may add another fourth voltage to the other first voltage level, the bit line voltage may add another fifth voltage to the other second voltage level, and the SO discharge time may add another sixth time to the other third time. In this case, the other fourth voltage may be less than the fourth voltage, the other fifth voltage may be less than the fifth voltage, and the other sixth time may be less than the sixth time.

The memory device 300 reads data corresponding to the read command based on the second sensing parameter set to which the second compensation value is applied (S1217).

Specifically, the memory device 300 may read data using the word line voltage that adds the other fourth voltage to the other first voltage level, the bit line voltage that adds the other fifth voltage to the other second voltage level, and the SO discharge time that adds the other sixth time to the other third time.

Figure 13:
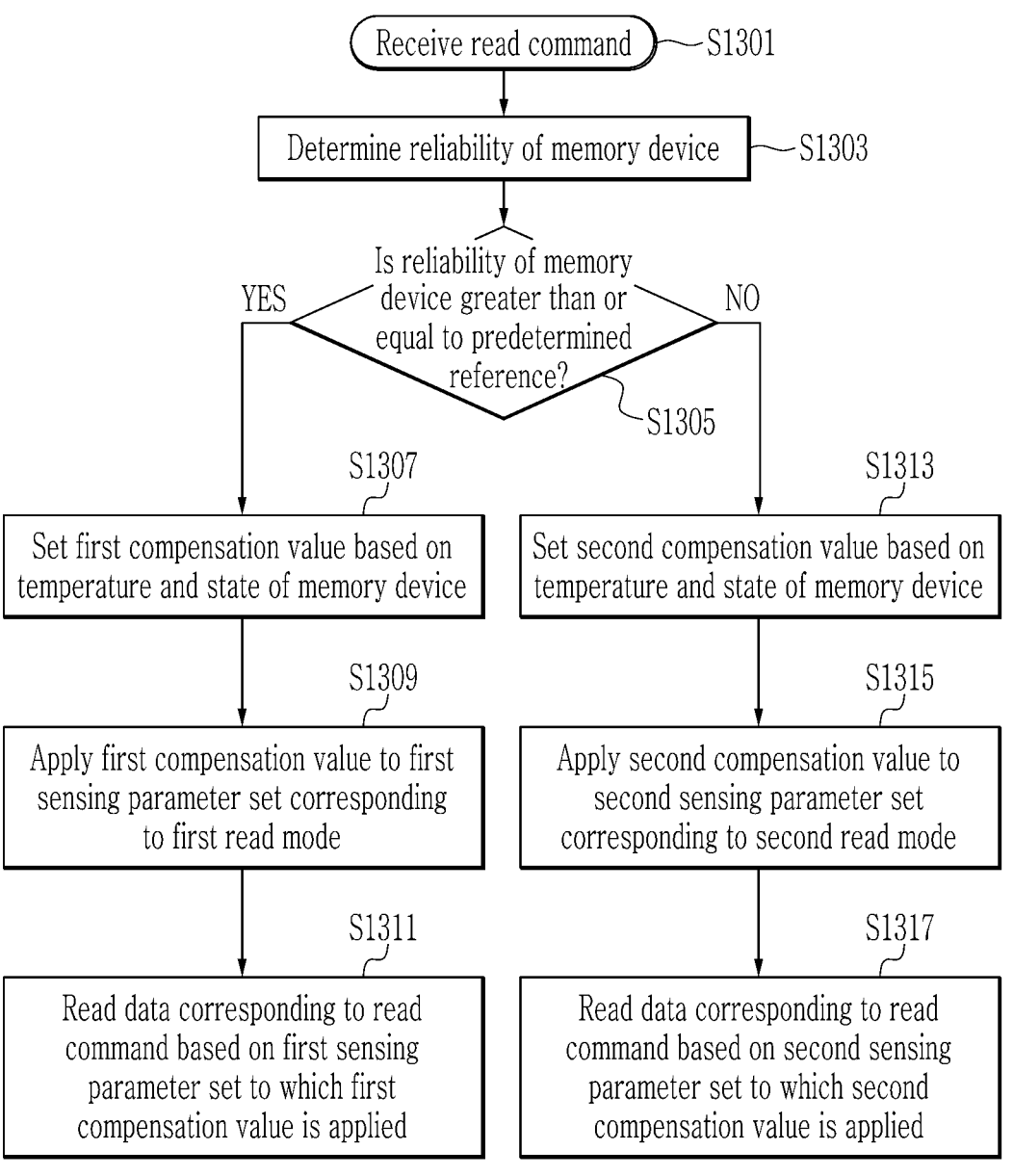
FIG. 13 is a flowchart showing an operation in which the memory system reads data according to an embodiment.

FIG. 13 is a flowchart showing an operation in which the memory system reads data according to an embodiment.

First, the memory system 10 receives the read command from the host (S1301).

The memory controller 200 determines reliability of the memory device 300 (S1303).

The memory controller 200 determines whether the reliability of the memory device 300 is greater than or equal to a predetermined reference (or a predetermined reference value) (S1305).

For example, if the reliability of the memory device 300 is greater than or equal to the predetermined reference, the memory controller 200 may read the memory device 300 in a first read mode.

If the reliability of the memory device 300 is greater than or equal to the predetermined reference, the memory controller 200 sets a first compensation value based on the temperature and a state of the memory device 300 (S1307).

If the reliability of the memory device 300 is greater than or equal to the predetermined reference, the memory device 300 may read data in the first read mode. Sensing parameters required to read the data depending on the first read mode may be preset. For example, the word line voltage may be set to a first voltage level, the bit line voltage may be set to a second voltage level, and the SO discharge time may be set to a third time.

On the other hand, if there is a difference between the temperature of the memory device 300 when the write operation is performed and the temperature of the memory device 300 when the read operation is performed, the memory controller 200 may apply a predetermined offset to the word line voltage.

In an embodiment, the first compensation value may be set based on the read mode, the temperature, and the state of the memory device 300. For example, the first compensation value may be set by adding a first sub-compensation value set based on a difference between the reference temperature and the current temperature of the memory device 300 to a second sub-compensation value set based on the state of the memory cell and the current temperature of the memory device 300.

The state of the memory cell corresponds to whether the memory cell is an on-cell or off-cell. As mentioned above, a threshold voltage of the memory cell may be determined by monitoring the sensing node of the page buffer PBi for a specific time (e.g., the SO discharge time) based on a selected word line voltage level, so that whether the memory cell is the on-cell or the off-cell is determined. However, the threshold voltage of the memory cell may be appropriately determined based on the state of the memory cell. For example, if a memory cell has multiple states, the memory cell may have a plurality of threshold voltages. In order to determine which of the plurality of states the memory cell is in, the plurality of threshold voltages of the memory cell may be determined by monitoring a sensing node of a page buffer PBi for a specific time (e.g., SO discharge time) based on a selected word line voltage level.

For example, if the reference temperature of the memory device 300 is 85° C. and the current temperature of the memory device 300 is 80° C., there is a difference of −5° C. compared with the reference temperature. If the temperature of the memory device 300 differs by −5° C. compared with the reference temperature in the case of the first read mode, the first sub-compensation value for each sensing parameter may be set in advance. In this case, predetermined first sub-compensation values may be stored in the memory device 300. Specifically, the compensation value for the word line voltage may be preset to a fourth voltage, the compensation value for the bit line voltage may be preset to a fifth voltage, and the compensation value for the SO discharge time may be preset to a sixth time. Here, the fourth voltage, the fifth voltage, or the sixth time may have a positive value as well as a negative value.

On the other hand, a state in which each page of the memory cell array 310 has to be read may be preset. For example, if the memory cell is a triple level cell (TLC), the memory cell may have an erase state (E), a first program state (P1), a second program state (P2), a third program state (P3), a fourth program state (P4), a fifth program state (P5), a sixth program state (P6), and a seventh program state (P7). In this case, the memory device 300 may read the first program state (P1) and the fifth program state (P5) in the case of an LSB page, may read the second program state (P2), the fourth program state (P4), and the sixth program state (P6) in the case of a CSB page, and may read the third program state (P3) and the seventh program state (P7) in the case of an MSB page.

A compensation value of each of the plurality of sensing parameters according to the state of the memory cell and the current temperature of the memory device 300 may be stored in the memory device 300. For example, the second sub-compensation value according to the current temperature of the memory device 300 for a case in which the memory device 300 reads the memory cell within the LSB page (that is, a case in which the first program state (P1) and the fifth program state (P5) are read) may be preset. In this case, predetermined second sub-compensation values may be stored in the memory device 300. Specifically, the compensation value for the word line voltage may be preset to a seventh voltage, the compensation value for the bit line voltage may be preset to an eighth voltage, and the compensation value for the SO discharge time may be preset to a ninth time. Here, the seventh voltage, the eighth voltage, or the ninth time may have a positive value as well as a negative value.

The memory device 300 applies the first compensation value to a first sensing parameter set corresponding to the first read mode (S1309).

The memory device 300 may apply the compensation value corresponding to each sensing parameter to each sensing parameter corresponding to the first read mode. Here, applying the compensation value may mean adding the compensation value corresponding to each sensing parameter to each sensing parameter. For example, the word line voltage may add the fourth voltage and the seventh voltage to the first voltage level, the bit line voltage may add the fifth voltage and the eighth voltage to the second voltage level, and the SO discharge time may add the sixth time and the ninth time to the third time.

The memory device 300 reads data corresponding to the read command based on the first sensing parameter set to which the first compensation value is applied (S1311).

Specifically, the memory device 300 may read data using the word line voltage that adds the fourth voltage and the seventh voltage to the first voltage level, the bit line voltage that adds the fifth voltage and the eighth voltage to the second voltage level, and the SO discharge time that adds the sixth time and the ninth time to the third time.

If the reliability of the memory device 300 is less than the predetermined reference, the memory controller 200 sets a second compensation value based on the temperature and the state of the memory device 300 (S1313).

If the reliability of the memory device 300 is less than the predetermined reference, the memory controller 200 may read data in a second read mode. Sensing parameters required to read the data depending on the second read mode may be preset. For example, the word line voltage may be set to another first voltage level, the bit line voltage may be set to another second voltage level, and the SO discharge time may be set to another third time.

On the other hand, if there is a difference between the temperature of the memory device 300 when the write operation is performed and the temperature of the memory device 300 when the read operation is performed, the memory controller 200 may apply a predetermined offset to the word line voltage.

In an embodiment, the second compensation value may be set based on the read mode, the temperature, and the state of the memory device 300. For example, the second compensation value may be set by adding a third sub-compensation value set based on a difference between the reference temperature and the current temperature of the memory device 300 to a fourth sub-compensation value set based on the state of the memory cell and the current temperature of the memory device 300.

For example, if the reference temperature of the memory device 300 is 85° C. and the current temperature of the memory device 300 is 80° C., there is a difference of −5° C. compared with the reference temperature. If the temperature of the memory device 300 differs by −5° C. compared with the reference temperature in the case of the second read mode, the third sub-compensation value for each sensing parameter may be set in advance. In this case, predetermined third sub-compensation values may be stored in the memory device 300. Specifically, the compensation value for the word line voltage may be preset to another fourth voltage, the compensation value for the bit line voltage may be preset to another fifth voltage, and the compensation value for the SO discharge time may be preset to another sixth time. Here, the other fourth voltage, the other fifth voltage, or the other sixth time may have a positive value as well as a negative value.

For example, the fourth sub-compensation value according to the current temperature of the memory device 300 for a case in which the memory device 300 reads the memory cell within the LSB page (that is, a case in which the first program state (P1) and the fifth program state (P5) are read) may be preset. In this case, predetermined fourth sub-compensation values may be stored in the memory device 300. Specifically, the compensation value for the word line voltage may be preset to another seventh voltage, the compensation value for the bit line voltage may be preset to another eighth voltage, and the compensation value for the SO discharge time may be preset to another ninth time. Here, the other seventh voltage, the other eighth voltage, or the other ninth time may have a positive value as well as a negative value.

The memory controller 200 applies the second compensation value to a second sensing parameter set corresponding to the second read mode (S1315).

The memory device 300 may apply the compensation value corresponding to each sensing parameter to each of the sensing parameters corresponding to the second read mode. Here, applying the compensation value may mean adding the compensation value corresponding to each sensing parameter to each sensing parameter. For example, the word line voltage may add the other fourth voltage and the other seventh voltage to the other first voltage level, the bit line voltage may add the other fifth voltage and the other eighth voltage to the other second voltage level, and the SO discharge time may add the other sixth time and the other ninth time to the other third time.

In this case, the other fourth voltage may be less than the fourth voltage, the other fifth voltage may be less than the fifth voltage, the other sixth time may be less than the sixth time, the other seventh voltage may be less than the seventh voltage, the other eighth voltage may be less than the eighth voltage, and the other ninth time may be less than the ninth time.

The memory device 300 reads data corresponding to the read command based on the second sensing parameter set to which the second compensation value is applied (S1317).

Specifically, the memory device 300 may read data using the word line voltage that adds the other fourth voltage and the other seventh voltage to the other first voltage level, the bit line voltage that adds the other fifth voltage and the other eighth voltage to the other second voltage level, and the SO discharge time that adds the other sixth time and the other ninth time to the other third time.

Accordingly, according to an operating method of the memory system 10 of an embodiment, the reliability of the memory device 300 may be secured by modifying the sensing parameter for sensing data of the memory device 300 according to the temperature of the memory device 300.

FIG. 14 is a block diagram showing an SSD system to which the memory device is applied according to an embodiment.

Referring to FIG. 14, the SSD system 1000 may include a host 1400 and an SSD 1300. The SSD 1300 exchanges signals with the host 1400 through a signal connector, and receives power supply through a power supply connector. The SSD 1300 may include an SSD controller 1310, an auxiliary power supply 1330, a buffer memory 1340, memory devices 1320, and a temperature sensor 1350. Each of a plurality of memory devices 1321, 1322, . . . , 132n may be a NAND flash memory device. The temperature sensor 1350 may measure a temperature of the SSD 1300.

In this case, the SSD controller 1310 may transmit a read command to each of the plurality of memory devices 1321, 1322, . . . , 132n in order to read data stored in each of the plurality of memory devices 1321, 1322, . . . , 132n. Each of the plurality of memory devices 1321, 1322, . . . , 132n may output data in response to the read command. In this case, the memory device 132*n* may determine reliability of the memory device 132*n* in response to the read command. For example, if data has recently been stored in the memory device 132*n* or a program/erase count of the memory device decreases, the memory device 132*n* may determine that the memory device 132*n* has high reliability. The memory device 132*n* may determine a mode for reading data within the memory device 132*n* based on the reliability. Sensing parameters (e.g., the word line voltage level, the bit line voltage level, the SO discharge time, or the like) required to read data from the memory device 132*n* depending on the determined read mode may be set in advance. On the other hand, the memory device 132*n* may receive the temperature of the SSD 1300 from the temperature sensor 1350 to modify the sensing parameters corresponding to the determined read mode. For example, as the temperature of the SSD 1300 differs from a predetermined reference by a certain reference, the memory device may add a predetermined compensation value to each sensing parameter. Accordingly, the SSD 1300 may compensate for a change in a cell current of a memory cell within the memory device 132*n* according to temperature, so that data are accurately read. In other words, the reliability of the memory device 132*n* may be secured by modifying the sensing parameter for sensing data of the memory device 132*n* according to a temperature of the memory device 132*n*.

The SSD controller 1310 may receive state data from the plurality of memory devices 1321, 1322, . . . , 132*n*. The SSD controller 1310 may output the state data of each of the plurality of memory devices 1321, 1322, . . . , 132*n* as one overall state data to the host 1400 through a plurality of data pins.

Although specific example embodiments have been shown and described, the scope of the present disclosure is not limited thereto. Therefore, those skilled in the art will understand that various modifications and other equivalent embodiments of the present disclosure are possible. Therefore, the true technical protective scope of the present disclosure must be determined based on the technical spirit of the appended claims.

What is claimed is:

1. A memory system comprising:
a memory device comprising a memory cell array and a control circuit; and
a temperature sensor configured to measure a temperature of the memory device to generate a temperature value,
wherein the control circuit is configured to:
set a compensation sensing parameter based on the temperature value,
determine a sensing parameter by applying the compensation sensing parameter to a basic sensing parameter corresponding to a read mode among a plurality of read modes having different read speeds, wherein the basic sensing parameter is preset in the memory device and/or the control circuit according to a read speed, and
read data from the memory cell array based on the sensing parameter.

2. The memory system of claim 1, further comprising a memory controller configured to determine the read mode based on a reliability index of the memory device,
wherein the reliability index comprises at least one of an address of a memory cell to be accessed within the memory cell array, a retention time, and a program/erase count of the memory device.

3. The memory system of claim 2, wherein the plurality of read modes comprises a first read mode and a second read mode,
wherein the second read mode is associated with a read speed that is slower than a read speed of the first read mode based on a time for applying a voltage to the memory cell array, and
wherein the memory controller is further configured to:
based on a reliability of the memory device being greater than or equal to a predetermined reference, control the memory device to use a first basic sensing parameter corresponding to the first read mode as the basic sensing parameter, and
based on the reliability of the memory device being less than the predetermined reference, control the memory device to use a second basic sensing parameter corresponding to the second read mode as the basic sensing parameter.

4. The memory system of claim 3, wherein the memory cell array comprises a plurality of memory cells connected to a plurality of word lines and a plurality of bit lines, and
wherein the basic sensing parameter comprises a word line voltage to be applied to a selected word line from the plurality of word lines and a bit line voltage to be applied to a selected bit line from the plurality of bit lines.

5. The memory system of claim 4, wherein the memory controller is further configured to apply an offset that is set based on a first temperature value of the memory device when the data are programmed in the memory cell array and a second temperature value when the data are read from the memory cell array to the word line voltage.

6. The memory system of claim 4, wherein the memory cell that is an access target among the memory cell array is connected to the selected word line and the selected bit line,
wherein the memory device further comprises:
a sensing node connected to the selected bit line; and
a page buffer circuit configured to sense the data of the memory cell that is the access target by measuring a current of the sensing node after a sensing node discharge time from a time when the word line voltage and the bit line voltage are applied to the memory cell array, and
wherein the basic sensing parameter further comprises the sensing node discharge time.

7. The memory system of claim 6, wherein the memory device is configured to:
based on the read mode being the first read mode and the temperature value being a first temperature, set a first compensation sensing parameter comprising a first sensing node discharge compensation time as the compensation sensing parameter, and
based on the read mode being the second read mode, the temperature value being the first temperature, and the first sensing node discharge compensation time being longer than a second sensing node discharge compensation time, set a second compensation sensing parameter comprising the second sensing node discharge compensation time as the compensation sensing parameter.

8. The memory system of claim 6, wherein the current flowing through the sensing node changes based on the data stored in the memory cell that is the access target, and
wherein the memory device is further configured to determine the compensation sensing parameter based on a state of the memory cell that is the access target.

9. The memory system of claim 8, wherein each memory cell of the plurality of memory cells has a plurality of states, and
wherein the memory device is configured to:
based on the read mode being the first read mode, the temperature value being a first temperature, and the memory cell that is the access target being at a first state among the plurality of states, set a first compensation sensing parameter comprising a first word line compensation voltage and a first bit line compensation voltage as the compensation sensing parameter, and
based on the read mode being the first read mode, the temperature value being the first temperature, and the memory cell that is the access target being at a second state having a threshold voltage lower than that of the first state, set a second compensation sensing parameter comprising a second word line compensation voltage lower than the first word line compensation voltage and a second bit line compensation voltage lower than the first bit line compensation voltage as the compensation sensing parameter.

10. The memory system of claim 8, wherein the plurality of memory cells have a plurality of states, and
wherein the memory device is configured to:
based on the read mode being the first read mode, the temperature value being a first temperature, and the memory cell that is the access target being at a first state among the plurality of states, set a first compensation sensing parameter comprising a first sensing node discharge compensation time as the compensation sensing parameter, and
based on the read mode being the first read mode, the temperature value being the first temperature, and the memory cell that is the access target being at a second state lower than the first state among the plurality of states, set a second compensation sensing parameter comprising a second sensing node discharge compensation time shorter than the first sensing node discharge compensation time as the compensation sensing parameter.

11. The memory system of claim 4, wherein the memory device is configured to:
based on the read mode being the first read mode and the temperature value being a first temperature, set a first compensation sensing parameter comprising a first word line compensation voltage and a first bit line compensation voltage as the compensation sensing parameter, and
based on the read mode being the second read mode and the temperature value being the first temperature, and the first word line compensation voltage being greater than a second word line compensation voltage, and the first bit line compensation voltage being greater than a second bit line compensation voltage, set a second compensation sensing parameter comprising the second word line compensation voltage and the second bit line compensation voltage as the compensation sensing parameter.

12. A memory system comprising:
a memory device comprising a memory cell array and a control circuit;
a memory controller configured to determine a read mode among a plurality of read modes associated with different read speeds based on a reliability index of the memory device; and a temperature sensor configured to measure a temperature of the memory device to generate a temperature value, wherein the control circuit is configured to:
set a compensation sensing parameter based on the temperature value,
determine a sensing parameter by applying the compensation sensing parameter to a basic sensing parameter corresponding to the read mode, and
read data from the memory cell array based on the sensing parameter.

13. The memory system of claim 12, wherein the memory cell array comprises a plurality of memory cells connected to a plurality of word lines and a plurality of bit lines, each memory cell of the plurality of memory cells having a plurality of states, the basic sensing parameter comprises a word line voltage to be applied to a word line from the plurality of word lines and a bit line voltage to be applied to a bit line from the plurality of bit lines,
wherein the memory device is configured to:
based on the read mode being a first read mode, the temperature value being a first temperature, and the memory cell that is an access target being at a first state among the plurality of states, set a first compensation sensing parameter comprising a first word line compensation voltage and a first bit line compensation voltage as the compensation sensing parameter, and
based on the read mode being the first read mode, the temperature value being the first temperature, and the memory cell that is the access target being at a second state having a threshold voltage lower than that of the first state, set a second compensation sensing parameter comprising a second word line compensation voltage lower than the first word line compensation voltage and a second bit line compensation voltage lower than the first bit line compensation voltage as the compensation sensing parameter.

14. The memory system of claim 12, wherein the memory cell array comprises a plurality of memory cells connected to a plurality of word lines and a plurality of bit lines, the plurality of memory cells have a plurality of states,
wherein a memory cell that is an access target among the memory cell array is connected to a word line selected from the plurality of word lines and a selected bit line from the plurality of bit lines,
wherein the memory device comprises a sensing node connected to the selected bit line,
wherein the memory device further comprises a page buffer circuit configured to sense data of the memory cell that is the access target by measuring a current of the sensing node after a sensing node discharge time from a time when a word line voltage and a bit line voltage are applied to the memory cell array, the basic sensing parameter further comprises the sensing node discharge time,
wherein the memory device is configured to:
based on the read mode being a first read mode, the temperature value is a first temperature, and the memory cell that is the access target being at a first state among the plurality of states, set a first compensation sensing parameter comprising a first sensing node discharge compensation time as the compensation sensing parameter, and
based on the read mode being the first read mode, the temperature value being the first temperature, and the memory cell that is the access target being at a second state lower than the first state among the plurality of states, set a second compensation sensing parameter comprising a second sensing node discharge compensation time shorter than the first sensing node discharge compensation time as the compensation sensing parameter.

15. An operating method of a memory system, the operating method comprising:

receiving, by a memory controller, a read command for a memory device, wherein the memory device comprises a memory cell array;

determining, by the memory controller, a reliability of the memory device;

determining, by the memory controller, a read mode of the memory device among a plurality of read modes having different read speeds based on the reliability;

setting, by the memory device, a compensation sensing parameter based on a temperature and the read mode of the memory device; and reading, by the memory device, data corresponding to the read command based on a basic sensing parameter corresponding to the read mode and the compensation sensing parameter.

16. The operating method of claim 15, wherein the determining the read mode of the memory device comprises:

based on the reliability of the memory device being greater than or equal to a predetermined reference, operating, by the memory controller, the memory device based on a first basic sensing parameter corresponding to a first read mode among the plurality of read modes; and based on the reliability of the memory device being less than the predetermined reference, operating, by the memory controller, the memory device based on a second basic sensing parameter corresponding to a second read mode that has a read speed slower than that of the first read mode among the plurality of read modes.

17. The operating method of claim 16, wherein the basic sensing parameter comprises a word line voltage to be applied to a word line selected from a plurality of word lines and a bit line voltage to be applied to a bit line selected from a plurality of bit lines, and wherein the setting of the compensation sensing parameter comprises:

based on the memory device operating in the first read mode and the temperature of the memory device being a first temperature, setting a first compensation sensing parameter comprising a first word line compensation voltage and a first bit line compensation voltage as the compensation sensing parameter; and based on the memory device operating in the second read mode and the temperature of the memory device being the first temperature, setting a second compensation sensing parameter comprising a second word line compensation voltage lower than the first word line compensation voltage and a second bit line compensation voltage lower than the first bit line compensation voltage as the compensation sensing parameter.

18. The operating method of claim 17, wherein the setting the compensation sensing parameter comprises:

based on the memory device operating in the first read mode, the temperature of the memory device is the first temperature, and a memory cell that is an access target is at a first state among a plurality of states, setting the first compensation sensing parameter comprising the first word line compensation voltage and the first bit line compensation voltage as the compensation sensing parameter; and based on the memory device operating in the first read mode, the temperature of the memory device being the first temperature, and the memory cell that is the access target being at a second state having a threshold voltage lower than that of the first state among the plurality of states, setting the second compensation sensing parameter comprising the second word line compensation voltage lower than the first word line compensation voltage and the second bit line compensation voltage lower than the first bit line compensation voltage as the compensation sensing parameter.

19. The operating method of claim 16, wherein the memory device comprises a sensing node connected to a memory cell that is an access target connected to a word line selected from a plurality of word lines and a bit line selected from a plurality of bit lines, wherein the memory device senses the data of the memory cell that is the access target by measuring a current of the sensing node after a sensing node discharge time from a time based on a word line voltage and a bit line voltage being applied to the memory cell array, wherein the basic sensing parameter comprising the sensing node discharge time, and wherein the setting the compensation sensing parameter comprises:

based on the memory device operating in the first read mode and the temperature of the memory device being a first temperature, setting a first compensation sensing parameter including a first sensing node discharge compensation time as the compensation sensing parameter; and based on the memory device operating in the second read mode and the temperature of the memory device being the first temperature, setting a second compensation sensing parameter including a second sensing node discharge compensation time shorter than the first sensing node discharge compensation time as the compensation sensing parameter.

20. The operating method of claim 19, wherein the setting the compensation sensing parameter comprises:

based on the memory device operating in the first read mode, the temperature of the memory device being the first temperature, and the memory cell that is the access target being at a first state among a plurality of states, setting the first compensation sensing parameter comprising the first sensing node discharge compensation time as the compensation sensing parameter; and based on the read mode being the first read mode, the temperature of the memory device being the first temperature, and the memory cell that is the access target being at a second state lower than the first state among the plurality of states, setting the second compensation sensing parameter comprising the second sensing node discharge compensation time shorter than the first sensing node discharge compensation time as the compensation sensing parameter.

* * * * *